(12) United States Patent
Wang et al.

(10) Patent No.: US 7,090,724 B2
(45) Date of Patent: Aug. 15, 2006

(54) LANGASITE SINGLE CRYSTAL INGOT, SUBSTRATE FOR PIEZOELECTRIC DEVICE AND METHOD FOR MANUFACTURE THEREOF, AND SURFACE ACOUSTIC WAVE DEVICE

(75) Inventors: Shouqi Wang, Saitama (JP); Satoshi Uda, Saitama (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 10/297,491

(22) PCT Filed: Dec. 21, 2000

(86) PCT No.: PCT/JP00/09115

§ 371 (c)(1),
(2), (4) Date: Aug. 11, 2003

(87) PCT Pub. No.: WO01/48276

PCT Pub. Date: Jul. 5, 2001

(65) Prior Publication Data
US 2004/0137727 A1 Jul. 15, 2004

(30) Foreign Application Priority Data

| Jan. 7, 2000 | (JP) | 2000-001426 |
| Jun. 1, 2000 | (JP) | 2000-165114 |
| Jun. 1, 2000 | (JP) | 2000-165119 |
| Nov. 10, 2000 | (JP) | 2000-344038 |

(51) Int. Cl.
*C30B 15/20* (2006.01)

(52) U.S. Cl. .......................... 117/11; 117/36; 117/937; 375/151; 375/153; 423/21.1

(58) Field of Classification Search ................. 117/13, 117/36, 937, 11; 423/21.1, 111; 375/151, 375/153
See application file for complete search history.

(56) References Cited

U.S. PATENT DOCUMENTS 6,302,956 B1 * 10/2001 Alenkov et al. ............... 117/13
6,303,048 B1 * 10/2001 Kawanaka et al. .... 252/62.9 R

FOREIGN PATENT DOCUMENTS

EP 0 865 156 A2 * 9/1998

(Continued)

OTHER PUBLICATIONS

H. Takeda et al.: "Effect of starting melt composition on crystal growth of La3Ga5SiO14" GROWTH, vol. 197, pp. 204-209 Feb. 1999.

(Continued)

Primary Examiner—Felisa Hiteshew
(74) Attorney, Agent, or Firm—Oblon, Spivak, McClelland, Maier & Neustadt, P.C.

(57) ABSTRACT

The contents by weight ratio of lanthanum oxide, gallium oxide, and silicon oxide, which are components, in the longitudinal cross-section and transverse cross-section of the straight part, excluding the shoulder part, of a Langasite single crystal ingot grown by pulling-up Langasite is within a range of ±0.05% with respect to the target amounts at all measured locations, and because of having a superior homogeneity in the content of components over the entire ingot, when used, for example, in a piezoelectric device such as an surface acoustic wave filter, has properties for industrial application that contribute to the stabilization of characteristics as well as reducing the costs.

12 Claims, 23 Drawing Sheets

| SAMPL REFERENCE | MIXTURE RATIO (WT. %) | | | CRYSTAL COMPOSITION (WT. %) | | | RESULT |
|---|---|---|---|---|---|---|---|
| | $La_2O_3$ | $Ga_2O_3$ | $SiO_2$ | $La_2O_3$ | $Ga_2O_3$ | $SiO_2$ | GROWTH STRIATION |
| A | 47.81 | 46.50 | 5.69 | 47.82 | 46.50 | 5.68 | ABSENT |
| B | 47.97 | 46.26 | 5.77 | 47.97 | 46.27 | 5.76 | ABSENT |
| C | 48.04 | 46.50 | 5.46 | 48.03 | 46.49 | 5.48 | ABSENT |
| D | 47.94 | 46.42 | 5.64 | 47.94 | 46.43 | 5.63 | ABSENT |
| ① | 47.99 | 46.15 | 5.86 | 47.83 | 46.12 | 6.06 | PRESENT |
| ② | 47.61 | 46.60 | 5.79 | 47.38 | 46.67 | 5.95 | PRESENT |
| ③ | 48.30 | 46.20 | 5.50 | 48.53 | 46.13 | 5.34 | PRESENT |
| ④ | 47.70 | 46.80 | 5.50 | 47.58 | 47.02 | 5.40 | PRESENT |
| ⑤ | 47.70 | 46.30 | 6.00 | 47.45 | 46.27 | 6.29 | PRESENT |

FOREIGN PATENT DOCUMENTS

| | | | |
|---|---|---|---|
| JP | 62-148390 | | 7/1987 |
| JP | 10-126209 | | 5/1998 |
| JP | 10-212195 | | 8/1998 |
| JP | 11199392 A | * | 7/1999 |
| JP | 411322495 A | * | 11/1999 |
| JP | 2000007499 A | * | 1/2000 |
| JP | 2001181093 A | * | 7/2001 |
| JP | 2002003293 A | * | 1/2002 |
| RU | 2 108 417 | | 4/1998 |

OTHER PUBLICATIONS

S. Uda et al.: "Growth of a 3' langasite crystal with clear faceting" Journal of Crystal Growth, vol. 211, pp. 318-324 Apr. 2000.

Wang, Shou-Qi, et al., "Study of congruent-melting composition of langasite and its effects on crystal quality", Journal of Crystal Growth, 219, 2000, pp. 263-268.

O.A. Buzanov, et al., "A New Approach to the Growth of Langasite Crystals", 1996 IEEE International Frequency Control Symposium, pp. 131-136. 1996.

* cited by examiner

FIG. 4

LONGITUDINAL CROSS-SECTION OF BODY OF INGOT OF THE PRESENT INVENTION

| MEASUREMENT LOCATION REFERENCE | CONTENTS (WT. %) | | |
|---|---|---|---|
| | $La_2O_3$ | $Ga_2O_3$ | $SiO_2$ |
| a-1 | 48.19 | 46.06 | 5.75 |
| a-2 | 48.17 | 46.08 | 5.75 |
| a-3 | 48.15 | 46.10 | 5.75 |
| a-4 | 48.13 | 46.12 | 5.75 |
| a-5 | 48.11 | 46.14 | 5.75 |
| b-1 | 48.18 | 46.07 | 5.75 |
| b-2 | 48.11 | 46.14 | 5.75 |
| b-3 | 48.14 | 46.11 | 5.75 |
| b-4 | 48.14 | 46.11 | 5.75 |
| b-5 | 48.12 | 46.13 | 5.75 |
| c-1 | 48.18 | 46.07 | 5.75 |
| c-2 | 48.17 | 46.08 | 5.75 |
| c-3 | 48.16 | 46.09 | 5.75 |
| c-4 | 48.12 | 46.13 | 5.75 |
| c-5 | 48.13 | 46.12 | 5.75 |
| TARGET CONTENTS | 48.15 | 46.10 | 5.75 |
| MAXIMUM VALUE | 48.19 | 46.14 | 5.75 |
| MINIMUM VALUE | 48.11 | 46.06 | 5.75 |

LONGITUDINAL CROSS-SECTION OF BODY OF THE CONVENTIONAL INGOT

| MEASUREMENT LOCATION REFERENCE | CONTENTS (WT. %) | | |
|---|---|---|---|
| | $La_2O_3$ | $Ga_2O_3$ | $SiO_2$ |
| a-1 | 48.53 | 45.67 | 5.81 |
| a-2 | 48.35 | 45.88 | 5.77 |
| a-3 | 48.11 | 46.15 | 5.74 |
| a-4 | 47.96 | 46.31 | 5.73 |
| a-5 | 47.77 | 46.53 | 5.70 |
| b-1 | 48.51 | 45.69 | 5.80 |
| b-2 | 48.36 | 45.86 | 5.77 |
| b-3 | 48.06 | 46.20 | 5.74 |
| b-4 | 47.94 | 46.34 | 5.72 |
| b-5 | 47.82 | 46.47 | 5.71 |
| c-1 | 48.49 | 45.72 | 5.79 |
| c-2 | 48.35 | 45.87 | 5.78 |
| c-3 | 48.08 | 46.18 | 5.74 |
| c-4 | 47.98 | 46.29 | 5.73 |
| c-5 | 47.79 | 46.50 | 5.71 |
| TARGET CONTENTS | 48.15 | 46.10 | 5.75 |
| MAXIMUM VALUE | 48.53 | 46.53 | 5.80 |
| MINIMUM VALUE | 47.77 | 45.67 | 5.70 |

FIG. 5

Longitudinal cross-section of body of ingot of the present invention:

| MEASUREMENT LOCATION REFERENCE | | CONTENTS (WT. %) | | |
|---|---|---|---|---|
| | | La$_2$O$_3$ | Ga$_2$O$_3$ | SiO$_2$ |
| TOP SECTION | A-1 | 48.11 | 46.14 | 5.75 |
| | A-2 | 48.10 | 46.15 | 5.75 |
| | A-3 | 48.12 | 46.13 | 5.75 |
| | A-4 | 48.10 | 46.15 | 5.75 |
| | A-5 | 48.11 | 46.14 | 5.75 |
| | B-1 | 48.13 | 46.12 | 5.75 |
| | B-2 | 48.10 | 46.15 | 5.75 |
| | B-3 | 48.12 | 46.13 | 5.75 |
| | B-4 | 48.11 | 46.14 | 5.75 |
| BOTTOM SECTION | A-1 | 48.15 | 46.10 | 5.75 |
| | A-2 | 48.17 | 46.08 | 5.75 |
| | A-3 | 48.18 | 46.07 | 5.75 |
| | A-4 | 48.15 | 46.10 | 5.75 |
| | A-5 | 48.16 | 46.09 | 5.75 |
| | B-1 | 48.14 | 46.11 | 5.75 |
| | B-2 | 48.18 | 46.07 | 5.75 |
| | B-3 | 48.15 | 46.10 | 5.75 |
| | B-4 | 48.16 | 46.09 | 5.75 |
| TARGET CONTENTS | | 48.15 | 46.10 | 5.75 |
| MAXIMUM VALUE | | 48.18 | 46.15 | 5.75 |
| MINIMUM VALUE | | 48.10 | 46.07 | 5.75 |

Longitudinal cross-section of body of the conventional ingot:

| MEASUREMENT LOCATION REFERENCE | | CONTENTS (WT. %) | | |
|---|---|---|---|---|
| | | La$_2$O$_3$ | Ga$_2$O$_3$ | SiO$_2$ |
| TOP SECTION | A-1 | 48.11 | 46.15 | 5.74 |
| | A-2 | 48.05 | 46.21 | 5.74 |
| | A-3 | 47.82 | 46.47 | 5.71 |
| | A-4 | 48.04 | 46.22 | 5.74 |
| | A-5 | 48.13 | 46.12 | 5.75 |
| | B-1 | 48.05 | 46.21 | 5.74 |
| | B-2 | 48.04 | 46.22 | 5.74 |
| | B-3 | 48.12 | 46.13 | 5.75 |
| | B-4 | 48.13 | 46.13 | 5.74 |
| BOTTOM SECTION | A-1 | 48.52 | 45.68 | 5.79 |
| | A-2 | 48.53 | 45.67 | 5.80 |
| | A-3 | 48.51 | 45.69 | 5.80 |
| | A-4 | 48.53 | 45.66 | 5.81 |
| | A-5 | 48.55 | 45.65 | 5.80 |
| | B-1 | 48.56 | 45.64 | 5.80 |
| | B-2 | 48.53 | 45.68 | 5.79 |
| | B-3 | 48.51 | 45.70 | 5.79 |
| | B-4 | 48.55 | 45.65 | 5.80 |
| TARGET CONTENTS | | 48.15 | 46.10 | 5.75 |
| MAXIMUM VALUE | | 48.56 | 46.47 | 5.80 |
| MINIMUM VALUE | | 47.82 | 45.64 | 5.71 |

FIG. 6
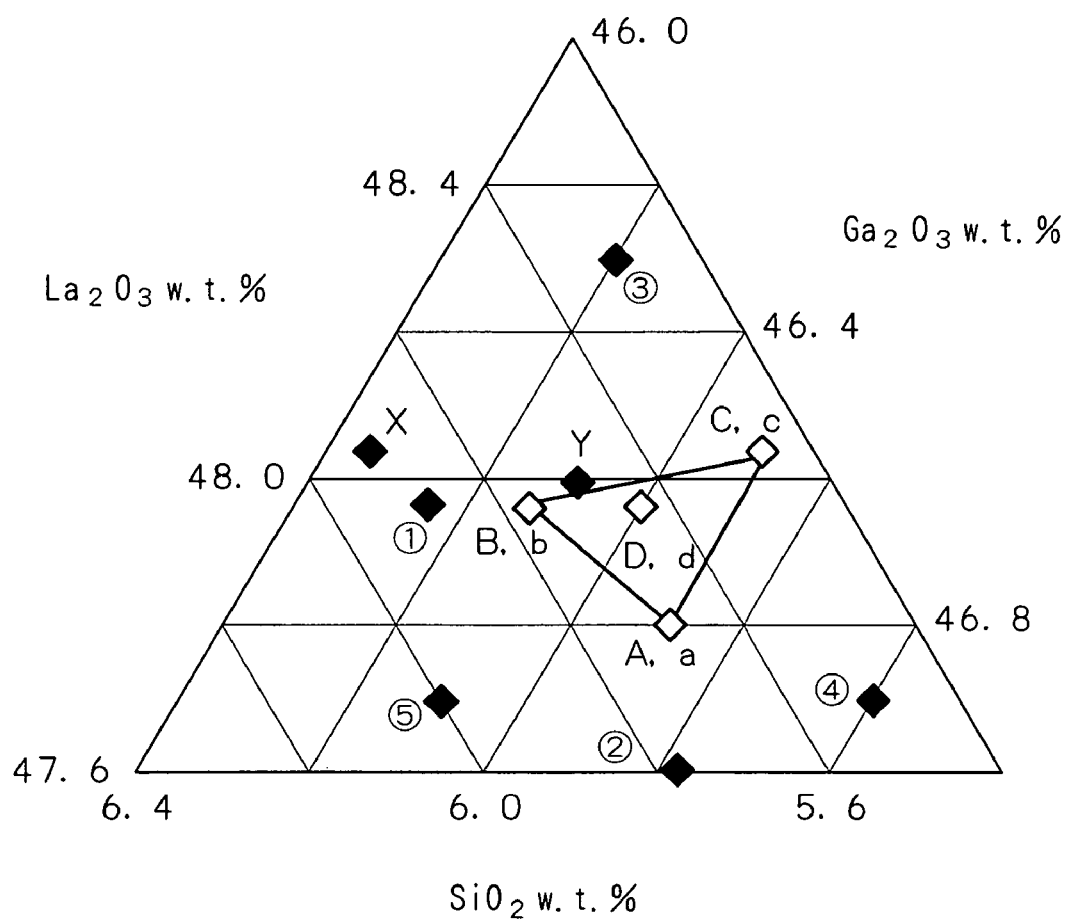
GROWTH STRIATIONS
PRESENT: 
ABSENT: 

FIG. 12

| SAMPL REFERENCE | MIXTURE RATIO (WT. %) | | | CRYSTAL COMPOSITION (WT. %) | | | RESULT |
|---|---|---|---|---|---|---|---|
| | $La_2O_3$ | $Ga_2O_3$ | $SiO_2$ | $La_2O_3$ | $Ga_2O_3$ | $SiO_2$ | GROWTH STRIATION |
| A | 47.81 | 46.50 | 5.69 | 47.82 | 46.50 | 5.68 | ABSENT |
| B | 47.97 | 46.26 | 5.77 | 47.97 | 46.27 | 5.76 | ABSENT |
| C | 48.04 | 46.50 | 5.46 | 48.03 | 46.49 | 5.48 | ABSENT |
| D | 47.94 | 46.42 | 5.64 | 47.94 | 46.43 | 5.63 | ABSENT |
| ① | 47.99 | 46.15 | 5.86 | 47.83 | 46.12 | 6.06 | PRESENT |
| ② | 47.61 | 46.60 | 5.79 | 47.38 | 46.67 | 5.95 | PRESENT |
| ③ | 48.30 | 46.20 | 5.50 | 48.53 | 46.13 | 5.34 | PRESENT |
| ④ | 47.70 | 46.80 | 5.50 | 47.58 | 47.02 | 5.40 | PRESENT |
| ⑤ | 47.70 | 46.30 | 6.00 | 47.45 | 46.27 | 6.29 | PRESENT |

FIG. 13

| MEASUREMENT LOCATIONS | CONTENTS (WT. %) | | |
|---|---|---|---|
| | $La_2O_3$ | $Ga_2O_3$ | $SiO_2$ |
| 1 | 47.93 | 46.45 | 5.62 |
| 2 | 47.92 | 46.46 | 5.62 |
| 3 | 47.93 | 46.43 | 5.64 |
| 4 | 47.92 | 46.45 | 5.63 |
| 5 | 47.95 | 46.45 | 5.60 |
| 6 | 47.91 | 46.46 | 5.63 |
| 7 | 47.92 | 46.45 | 5.63 |
| TARGET CONTENTS | 47.93 | 46.45 | 5.62 |
| MAXIMUM VALUE | 47.95 | 46.46 | 5.64 |
| MINIMUM VALUE | 47.91 | 46.43 | 5.60 |

FIG. 18

| SAMPLE REFERENCE | MIXED RATIO (WT. %) | | | CRYSTAL COMPOSITION (WT. %) | | | RESULT |
|---|---|---|---|---|---|---|---|
| | $La_2O_3$ | $Ga_2O_3$ | $SiO_2$ | $La_2O_3$ | $Ga_2O_3$ | $SiO_2$ | SECONDARY PHASES |
| A | 47.98 | 46.32 | 5.70 | 47.98 | 46.32 | 5.70 | ABSENT |
| B | 48.50 | 46.32 | 5.18 | 48.48 | 46.32 | 5.20 | ABSENT |
| C | 48.50 | 47.50 | 4.00 | 48.49 | 47.49 | 4.02 | ABSENT |
| D | 47.50 | 47.50 | 5.00 | 47.52 | 47.49 | 4.99 | ABSENT |
| E | 47.50 | 46.32 | 6.18 | 47.52 | 46.32 | 6.16 | ABSENT |
| F | 47.50 | 46.00 | 6.50 | 47.51 | 46.01 | 6.48 | ABSENT |
| G | 47.98 | 46.00 | 6.02 | 47.98 | 46.02 | 6.00 | ABSENT |
| H | 49.00 | 46.00 | 5.00 | 48.65 | 46.31 | 5.04 | PRESENT |
| I | 49.00 | 47.00 | 4.00 | 48.62 | 47.14 | 4.24 | PRESENT |
| J | 48.00 | 48.00 | 4.00 | 47.96 | 47.75 | 4.29 | PRESENT |
| K | 47.00 | 48.00 | 5.00 | 47.36 | 47.60 | 5.04 | PRESENT |
| L | 47.00 | 47.00 | 6.00 | 47.36 | 46.79 | 5.85 | PRESENT |
| M | 48.04 | 46.06 | 5.90 | 47.95 | 46.33 | 5.72 | PRESENT |

FIG. 19

| MEASUREMENT LOCATIONS | CONTENTS (WT. %) | | |
|---|---|---|---|
| | $La_2O_3$ | $Ga_2O_3$ | $SiO_2$ |
| 1 | 47.93 | 46.66 | 5.41 |
| 2 | 47.92 | 46.67 | 5.41 |
| 3 | 47.93 | 46.66 | 5.41 |
| 4 | 47.92 | 46.65 | 5.43 |
| 5 | 47.95 | 46.65 | 5.40 |
| 6 | 47.91 | 46.66 | 5.43 |
| 7 | 47.92 | 46.67 | 5.41 |
| TARGET CONTENTS | 47.93 | 46.66 | 5.41 |
| MAXIMUM VALUE | 47.95 | 46.67 | 5.43 |
| MINIMUM VALUE | 47.91 | 46.65 | 5.40 |

FIG. 20

| MEASUREMENT LOCATIONS | CONTENTS (WT. %) | | |
|---|---|---|---|
| | $La_2O_3$ | $Ga_2O_3$ | $SiO_2$ |
| 1 | 48.08 | 46.03 | 5.89 |
| 2 | 48.00 | 46.06 | 5.94 |
| 3 | 47.97 | 46.07 | 5.96 |
| 4 | 47.87 | 46.08 | 6.05 |
| 5 | 47.81 | 46.15 | 6.04 |
| 6 | 47.62 | 46.18 | 6.20 |
| 7 | 47.55 | 46.26 | 6.20 |
| TARGET CONTENTS | 48.04 | 46.06 | 5.91 |
| MAXIMUM VALUE | 48.08 | 46.26 | 6.20 |
| MINIMUM VALUE | 47.55 | 46.03 | 5.89 |

MEASUREMENT LOCATIONS
(THE PRESENT INVENTION)

FIG. 26

| SAMPLE REFERENCE | MIXED RATIO (WT. %) | | | CRYSTAL COMPOSITION (WT. %) | | | RESULTS | |
|---|---|---|---|---|---|---|---|---|
| | La$_2$O$_3$ | Ga$_2$O$_3$ | SiO$_2$ | La$_2$O$_3$ | Ga$_2$O$_3$ | SiO$_2$ | CRACKS | INCLUSIONS |
| ① | 48.76 | 45.28 | 5.96 | 48.80 | 45.25 | 5.95 | ABSENT | ABSENT |
| ② | 48.75 | 46.02 | 5.23 | 48.80 | 45.99 | 5.21 | ABSENT | ABSENT |
| ③ | 48.22 | 46.55 | 5.23 | 48.19 | 46.60 | 5.21 | ABSENT | ABSENT |
| ④ | 48.13 | 46.57 | 5.30 | 48.10 | 46.60 | 5.30 | ABSENT | ABSENT |
| ⑤ | 48.14 | 45.72 | 6.14 | 48.10 | 45.71 | 6.19 | ABSENT | ABSENT |
| ⑥ | 48.54 | 45.30 | 6.16 | 48.56 | 45.25 | 6.19 | ABSENT | ABSENT |
| ⑦ | 48.47 | 45.76 | 5.77 | 48.47 | 45.75 | 5.78 | ABSENT | ABSENT |
| ⑧ | 48.35 | 46.22 | 5.43 | 48.35 | 46.21 | 5.44 | ABSENT | ABSENT |
| ⑨ | 48.90 | 45.25 | 5.85 | 49.10 | 45.10 | 5.80 | PRESENT | PRESENT |
| ⑩ | 48.90 | 45.95 | 5.15 | 49.05 | 45.90 | 5.05 | PRESENT | PRESENT |
| ⑪ | 48.00 | 46.75 | 5.25 | 47.90 | 45.90 | 5.20 | PRESENT | PRESENT |
| ⑫ | 47.90 | 45.75 | 6.35 | 47.79 | 45.65 | 6.56 | PRESENT | PRESENT |
| ⑬ | 48.45 | 45.30 | 6.25 | 48.40 | 45.10 | 6.50 | ABSENT | PRESENT |

FIG. 27

THE PRESENT INVENTION

| MEASUREMENT LOCATIONS | CONTENTS (WT. %) | | |
|---|---|---|---|
| | $La_2O_3$ | $Ga_2O_3$ | $SiO_2$ |
| 1 | 48.26 | 46.01 | 5.73 |
| 2 | 48.24 | 46.03 | 5.73 |
| 3 | 48.27 | 46.00 | 5.73 |
| 4 | 48.23 | 46.02 | 5.75 |
| 5 | 48.25 | 46.02 | 5.73 |
| 6 | 48.24 | 46.04 | 5.72 |
| 7 | 48.23 | 46.04 | 5.73 |
| TARGET CONTENTS | 48.25 | 46.02 | 5.73 |
| MAXIMUM VALUE | 48.27 | 46.04 | 5.75 |
| MINIMUM VALUE | 48.23 | 46.00 | 5.72 |

FIG. 28

THE PRESENT INVENTION

WAFER 1

| MEASUREMENT LOCATIONS | CONTENTS (WT. %) | | |
|---|---|---|---|
| | $La_2O_3$ | $Ga_2O_3$ | $SiO_2$ |
| a | 48.26 | 46.01 | 5.73 |
| b | 48.24 | 46.03 | 5.73 |
| c | 48.23 | 46.02 | 5.75 |
| d | 48.25 | 46.01 | 5.74 |
| e | 48.23 | 46.04 | 5.73 |
| TARGET CONTENTS | 48.25 | 46.02 | 5.73 |
| MAXIMUM VALUE | 48.26 | 46.04 | 5.75 |
| MINIMUM VALUE | 48.23 | 46.01 | 5.73 |

WAFER 2

| MEASUREMENT LOCATIONS | CONTENTS (WT. %) | | |
|---|---|---|---|
| | $La_2O_3$ | $Ga_2O_3$ | $SiO_2$ |
| a | 48.23 | 46.02 | 5.75 |
| b | 48.25 | 46.02 | 5.73 |
| c | 48.24 | 46.03 | 5.73 |
| d | 48.25 | 46.02 | 5.73 |
| e | 48.26 | 46.01 | 5.73 |
| TARGET CONTENTS | 48.25 | 46.02 | 5.73 |
| MAXIMUM VALUE | 48.23 | 46.03 | 5.75 |
| MINIMUM VALUE | 48.23 | 46.01 | 5.73 |

WAFER 3

| MEASUREMENT LOCATIONS | CONTENTS (WT. %) | | |
|---|---|---|---|
| | $La_2O_3$ | $Ga_2O_3$ | $SiO_2$ |
| a | 48.23 | 46.04 | 5.73 |
| b | 48.22 | 46.05 | 5.73 |
| c | 48.23 | 46.04 | 5.73 |
| d | 48.26 | 46.01 | 5.73 |
| e | 48.23 | 46.04 | 5.73 |
| TARGET CONTENTS | 48.25 | 46.02 | 5.73 |
| MAXIMUM VALUE | 48.26 | 46.05 | 5.73 |
| MINIMUM VALUE | 48.22 | 46.01 | 5.73 |

CONVENTIONAL ART

WAFER 1

| MEASUREMENT LOCATIONS | CONTENTS (WT. %) | | |
|---|---|---|---|
| | $La_2O_3$ | $Ga_2O_3$ | $SiO_2$ |
| a | 48.09 | 46.03 | 5.89 |
| b | 47.83 | 46.25 | 5.92 |
| c | 47.91 | 46.16 | 5.94 |
| d | 47.81 | 46.23 | 5.96 |
| e | 47.86 | 46.19 | 5.93 |
| TARGET CONTENTS | 48.04 | 46.06 | 5.90 |
| MAXIMUM VALUE | 48.08 | 46.25 | 5.96 |
| MINIMUM VALUE | 47.81 | 46.03 | 5.89 |

WAFER 2

| MEASUREMENT LOCATIONS | CONTENTS (WT. %) | | |
|---|---|---|---|
| | $La_2O_3$ | $Ga_2O_3$ | $SiO_2$ |
| a | 47.87 | 46.06 | 6.05 |
| b | 47.72 | 46.20 | 6.08 |
| c | 47.69 | 46.21 | 6.10 |
| d | 47.75 | 46.22 | 6.03 |
| e | 47.70 | 46.24 | 6.06 |
| TARGET CONTENTS | 48.04 | 46.06 | 5.90 |
| MAXIMUM VALUE | 47.67 | 46.24 | 6.10 |
| MINIMUM VALUE | 47.69 | 46.08 | 6.03 |

WAFER 3

| MEASUREMENT LOCATIONS | CONTENTS (WT. %) | | |
|---|---|---|---|
| | $La_2O_3$ | $Ga_2O_3$ | $SiO_2$ |
| a | 47.55 | 46.26 | 6.20 |
| b | 47.46 | 46.29 | 6.25 |
| c | 47.52 | 46.27 | 6.21 |
| d | 47.40 | 46.42 | 6.18 |
| e | 47.51 | 46.25 | 6.24 |
| TARGET CONTENTS | 48.04 | 46.06 | 5.90 |
| MAXIMUM VALUE | 47.55 | 46.42 | 6.25 |
| MINIMUM VALUE | 47.40 | 46.25 | 6.20 |

LANGASITE SINGLE CRYSTAL INGOT, SUBSTRATE FOR PIEZOELECTRIC DEVICE AND METHOD FOR MANUFACTURE THEREOF, AND SURFACE ACOUSTIC WAVE DEVICE

BACKGROUND OF THE INVENTION

1. Field of the Invention

The present invention relates to a Langasite single crystal ingot having a very small variation in the contents of the components, lanthanum oxide (hereinbelow, $La_2O_3$), gallium oxide (hereinbelow, $Ga_2O_3$), and silicon oxide (hereinbelow, $SiO_2$), through the entire straight part, excluding the shoulder part that is formed during the early growth by pulling up a seed crystal, and thereby has a superior homogeneity in the contents of the components. The present invention further relates to a method for manufacturing a substrate of a piezoelectric device suitable for a SAW filter and a piezoelectric device substrate, and a surface acoustic wave device using the same.

The present application is based on patent applications filed in Japan (Japanese Patent Application No. Hei 11-377335; Japanese Patent Application No. 2000-001426; Japanese Patent Application No. 2000-165114; and Japanese Patent Application No. 2000-165119), the contents of which are incorporated herein by reference.

2. Description of the Related Art

Recently, single crystals of Langasite represented by the formula $La_3Ga_5SiO_{14}$ (Langasite) and comprising in terms of weight (mass) ratios:

$La_2O_3$: 48.04%,
$Ga_2O_3$: 46.06%,
$SiO_2$: 5.90%, and having such characteristics as:
(a) the rate of change due to temperature of the surface acoustic wave propagation velocity is low, and the rate of change due to temperature of the frequency is low; and
(b) the electromechanical coupling coefficient that represents the dimensions of the piezoelectric characteristics (the coefficient representing the mutual conversion rate between the electrical energy and the mechanical energy) is large, has become the focus of attention as a substrate material for piezoelectric devices such as surface acoustic wave (SAW) filters, as is disclosed in Japanese Unexamined Patent Application, First Publication, No. Hei 10-126209, and have become the object of research (for example, H. Takeda, K. Shimumura, V. I. Chani, T. Fukuda, "Effect of starting melt composition on crystal growth of $La_3Ga_5SiO_{14}$", J. Crystal Growth 197 (1999) 204). Specifically, a Langasite single crystal has temperature characteristics equivalent to those of quartz crystal, and furthermore, it has an electromechanical coupling coefficient about 3 times that of quartz crystal, and thus can be used for broadening the bandwidth of SAW filters that have many uses, such as in cell phones, and make them more compact.

It is known that when applying the above as a substrate material or the like, the straight part of the Langasite single crystal ingot, which is the part remaining after eliminating the ingot shoulder formed during the initial growth by pulling up the seed crystal, is sliced, and supplied for actual use in the form of a wafer of a predetermined thickness. Then the Langasite single crystal ingot is manufactured by the seed crystal of the Langasite being fastened to the distal end of the pull shaft, and when this seed crystal is brought into contact in a crucible with the surface of the Langasite melt having a predetermined composition, and ingot growth is carried out by pulling up the pull shaft while it is being rotated.

Conventionally, to grow this Langasite single crystal, the single crystal is grown by melting raw material pellets based on the composition of the stoichiometric composition ratio.

The progress of single crystal growth by pulling up technology in recent years has been remarkable, and the demands for lower energy consumption, lower power consumption, and lower cost have become strong. Accompanying this, there has been a trend to increase the diameter of the Langasite single crystal ingot even further. However, in the conventional Langasite single crystal ingot described above, variation in the contents of $La_2O_3$, $Ga_2O_3$, and $SiO_2$, which are the components, over the entire ingot occurs easily, and in particular, the variation of the content of the $Ga_2O_3$ is severe. Especially, when the diameter of the ingots becomes large, the variation becomes remarkable. Therefore, in the current situation, the growth of a single crystal ingot having a stable composition over the entire ingot has been difficult.

In addition, when growing a Langasite single crystal with the composition conventionally used having the stoichiometric composition or the like, the fluctuation of the growth rate that accompanies a discontinuous saturation degree is associated with fluctuations in the composition, and there is the disadvantage that growth striations occur. When growth striations are present in the surface of a wafer that is cut out from this crystal, there are variations in the mechanical strength, and when it undergoes a polishing process, surface irregularities are produced, and there is the problem that this has a deleterious influence on the properties of a SAW filter. In addition, the convection velocity of the melt is influenced in the direction of the diameter, and thus the composition differs at each point on the surface, and as a result, the surface acoustic wave velocity in the wafer surface also becomes irregular.

Furthermore, when a Langasite single crystal is grown using the conventional stoichiometric composition or the like, differences in the composition of the substrate surface and the top section and the bottom section of the growth crystal occur that are caused by differences due to the congruent melt composition (congruent composition). As a result, secondary phases and defects easily occur in the crystal, the crystal cracks easily, and in the case that the differences are large, entrapped inclusions can be seen. In addition, in order to suppress the generation of secondary phases, the growth rate must be set at an extremely low value, and there is the problem that the production efficiency deteriorates. Furthermore, because Ga has the property of being highly volatile among the atoms that form the Langasite single crystal, depending on the composition, there is the disadvantage that a stable growth by pulling up is difficult due to this high volatility.

These differences in the crystal composition have a significant influence on the properties of a SAW filter, and in particular the propagation velocity of an surface acoustic wave is dependent on the density of the material, and thus as a result of the fluctuations in the composition from the top section to the bottom section of the crystal, the density of the crystal fluctuates, and thereby the propagation velocity of the substrates that are cut out from the top section to the bottom section of the crystal will fluctuate. The center frequency, which is an important property of the SAW filter, is determined by the propagation velocity and the dimensions of the interdigital transducer of the element, and thus a SAW filter manufactured by the same interdigital transducer design using such a substrate will have a large propagation velocity variation and a large center frequency variation, and cannot be practically used.

In growth using a composition that deviates largely from the congruent melt composition, in the growth interface, the effective distribution coefficient of each of the components of the melt are influenced by the convection velocity of the melt, and thus the composition will also differ at each point of the interface. As a result, the surface acoustic wave velocity (propagation velocity) will become dispersed. Therefore, in the conventional technology that uses raw material pellets based on the composition of the stoichiometric composition ratio, obtaining a uniform Langasite crystal has been difficult.

SUMMARY OF THE INVENTION

In consideration of the above described points, it is an object of the present invention to provide a Langasite single crystal ingot in which a superior homogeneity in the amount of the incorporated components is obtained, growth striations occur with difficulty, a surface acoustic wave propagation velocity with little variation is obtained, secondary phases occur with difficulty, the influence of the volatility of the Ga is small, defects and the like in the crystal are few, and a propagation velocity with little variation can be obtained; a method of manufacturing a substrate of a piezoelectric device; a substrate for a piezoelectric device; and a surface acoustic wave device using the same.

Thus, from the standpoint described above, the present applicants carried out studies in which a Langasite single crystal ingot was developed that had a small variation in the amount of the incorporated components over the entire ingot. As a result of these studies, research results described in (1) and (2) below were attained:

(1) The variation in the content of components in the Langasite single crystal ingot is caused in particular by the vaporization of the $Ga_2O_3$, which is a composition constituent, during the growth of the single crystal ingot by pulling up, and as a result of this, as the growth of the ingot by pulling up progresses, the content of $Ga_2O_3$ in the melt in the crucible gradually decreases. In this case, while the $La_2O_3$ and the $SiO_2$ do not substantially vaporize during the ingot growth, their incorporated proportion becomes gradually larger with the passage of time in comparison to the actually incorporated proportion during the initial growth of the ingot due to the $Ga_2O_3$ in the melt decreasing over time due to vaporization in the crucible. Thereby, the larger the diameter of the ingot becomes, the larger the variation becomes, and for example, in the case that the large ingot having a diameter of 100 mm, the variation in the content of $Ga_2O_3$ over the entire ingot has the wide range of ±0.5 wt. % in comparison with the target content;

(2) During the growth of the single crystal ingot by pulling up, the weight of the melt in the crucible and the growth ingot are respectively measured continuously and discontinuously, and the remaining amount after the combined amounts that are a result of this measurement is subtracted from the weight of the melt in the crucible before the start of the ingot growth is treated as the amount of the vaporization loss of the $Ga_2O_3$. When the growth of the single crystal ingot is carried out while supplementing this amount of vaporization loss of the $Ga_2O_3$ in the melt from the melt surface of the crucible, that is, when growing the ingot while carrying out control such that the sum of the weight of the melt in the crucible while supplementing this amount of vaporization loss of the $Ga_2O_3$ and the weight of the ingot during the growth by pulling up is always identical to the weight of the melt in the crucible before the start of the growth by pulling up, the local variations in the amount of the incorporated $Ga_2O_3$ in the single crystal ingot after growth are eliminated, and this is represented by there being no fluctuation in the content of $La_2O_3$ and $SiO_2$ as well. The entire single crystal ingot has a uniform amount of incorporated components, and even in the case, for example, of a large diameter crystal having a diameter equal to or greater than 100 mm, when measured in the longitudinal surface and the transverse surface of the straight part of the ingot, the variations in the amounts of the components fall in the extremely narrow range of ±0.05 wt. % with respect to the target contents at all measured locations when measured according to the weight proportion.

This invention is based on the results of the investigations described above 1 and 2, and in the Langasite single crystal ingot of Langasite represented by the formula $La_3Ga_5SiO_{14}$ grown by pulling up, the Langasite single crystal ingot of the present invention having superior homogeneity in the contents of the components is characterized in that the contents by the weight ratio of the lanthanum oxide, gallium oxide, and silicon oxide, which are components, in the longitudinal cross-section and the transverse cross-section of the straight part, excluding the shoulder part, falls within a range of ±0.05 wt. % with respect to the target contents at all measurement locations.

In addition, as a result of carrying out investigations of the manufacturing technology for Langasite single crystals, the present inventors were able to discover the composition conditions wherein growth striations are almost completely absent. Therefore, the present invention is technology based on this knowledge, and uses the following structure in order to solve the problems described above.

Specifically, the manufacturing method of the substrate for the piezoelectric device of the present invention is one for a substrate of a piezoelectric device wherein the Langasite single crystal ingot of the present invention is grown and then processed into a substrate of a piezoelectric device, and is characterized in that the weight measurement is set within a composition range delimited, as shown in FIG. 6, by point A ($La_2O_3$ at 47.81 wt. %; $Ga_2O_3$ at 46.50 wt %; and $SiO_2$ at 5.69 wt. %), by point B ($La_2O_3$ at 47.97 wt. %; $Ga_2O_3$ at 46.26 wt %; and $SiO_2$ at 5.77 wt. %), and by point C ($La_2O_3$ at 48.04 wt. %; $Ga_2O_3$ at 46.50 wt %; and $SiO_2$ at 5.46 wt. %), these components are melted in a crucible, and a single crystal of $La_3Ga_5SiO_{14}$ is grown by pulling up from inside this crucible.

In addition, the substrate for the piezoelectric device of the present invention is one formed from the Langasite single crystal ingot of the present invention, and is characterized in that the weight measurement is set within a composition range delimited, as shown in FIG. 6, by point A ($La_2O_3$ at 47.81 wt. %; $Ga_2O_3$ at 46.50 wt %; and $SiO_2$ at 5.69 wt. %), by point B ($La_2O_3$ at 47.97 wt. %; $Ga_2O_3$ at 46.26 wt %; and $SiO_2$ at 5.77 wt. %), and by point C ($La_2O_3$ at 48.04 wt. %; $Ga_2O_3$ at 46.50 wt %; and $SiO_2$ at 5.46 wt. %), these components are melted in a crucible, and a single crystal is grown by pulling up from inside this crucible.

In addition, the substrate for the piezoelectric device of the present invention is one formed from the Langasite single crystal ingot of the present invention, and is characterized in being a single crystal set within the composition range delimited, as shown in FIG. 6, by point a ($La_2O_3$ at 47.82 wt. %; $Ga_2O_3$ at 46.50 wt %; and $SiO_2$ at 5.68 wt. %), by point b ($La_2O_3$ at 47.97 wt. %; $Ga_2O_3$ at 46.27 wt %; and SiO$_2$ at 5.76 wt. %), and by point c (La$_2$O$_3$ at 48.03 wt. %; Ga$_2$O$_3$ at 46.49 wt %; and SiO$_2$ at 5.48 wt. %).

In the manufacturing method for a substrate of a piezoelectric device and the substrate for the piezoelectric device, based on the experimental results described above, the respective composition ranges of the La$_2$O$_3$, Ga$_2$O$_3$, and SiO$_2$, which are the raw materials for La$_3$Ga$_5$SiO$_{14}$, are weight measured within the ranges described above, melted in a crucible, and a single crystal of La$_3$Ga$_5$SiO$_{14}$ is grown by pulling up from this crucible. In addition, the La$_3$Ga$_5$SiO$_{14}$ is a single crystal where the La$_2$O$_3$, Ga$_2$O$_3$, and SiO$_2$ are set within the composition ranges described above, and thereby a high quality La$_3$Ga$_5$SiO$_{14}$ single crystal is obtained in which the occurrence of growth striations is extremely low, and at the same time a substrate is obtained that has a surface acoustic wave propagation velocity with little variation and a uniform center frequency.

In addition, as a result of the investigations carried out, the present inventors were able to discover the composition conditions wherein secondary phases are almost completely absent. Furthermore, they were able to discover the composition conditions in which the influence of the volatility of the Ga was small, and thus a stable growth is possible. Therefore, the present invention is a technology based on this knowledge, and uses the following composition in order to solve the problems described above.

Specifically, the manufacturing method of the substrate for the piezoelectric device of the present invention is one for a substrate of a piezoelectric device wherein the Langasite single crystal ingot of the present invention is grown, and then processed into a substrate of a piezoelectric device, and is characterized in that the weight measurement is set within a composition range delimited, as shown in FIG. 14, by point A (La$_2$O$_3$ at 47.98 wt. %; Ga$_2$O$_3$ at 46.32 wt %; and SiO$_2$ at 5.70 wt. %), by point B (La$_2$O$_3$ at 48.50 wt. %; Ga$_2$O$_3$ at 46.32 wt %; and SiO$_2$ at 5.18 wt. %), by point C (La$_2$O$_3$ at 48.50 wt. %; Ga$_2$O$_3$ at 47.50 wt %; and SiO$_2$ at 4.00 wt. %), by point D (La$_2$O$_3$ at 47.50 wt. %; Ga$_2$O$_3$ at 47.50 wt %; and SiO$_2$ at 5.00 wt. %), by point E (La$_2$O$_3$ at 47.50 wt. %; Ga$_2$O$_3$ at 46.32 wt %; and SiO$_2$ at 6.18 wt. %), by point F (La$_2$O$_3$ at 47.50 wt. %; Ga$_2$O$_3$ at 46.00 wt %; and SiO$_2$ at 6.50 wt. %), and by point G (La$_2$O$_3$ at 47.98 wt. %; Ga$_2$O$_3$ at 46.00 wt %; and SiO$_2$ at 6.02 wt. %), these components are melted in a crucible, and a single crystal of La$_3$Ga$_5$SiO$_{14}$ is grown by pulling up from inside this crucible.

In addition, the substrate for the piezoelectric device of the present invention is one formed from the Langasite single crystal ingot of the present invention, and is characterized in that the weight measurement is set within a composition range delimited, as shown in FIG. 14, by point A (La$_2$O$_3$ at 47.98 wt. %; Ga$_2$O$_3$ at 46.32 wt %; and SiO$_2$ at 5.70 wt. %), by point B (La$_2$O$_3$ at 48.50 wt. %; Ga$_2$O$_3$ at 46.32 wt %; and SiO$_2$ at 5.18 wt. %), by point C (La$_2$O$_3$ at 48.50 wt. %; Ga$_2$O$_3$ at 47.50 wt %; and SiO$_2$ at 4.00 wt. %), by point D (La$_2$O$_3$ at 47.50 wt. %; Ga$_2$O$_3$ at 47.50 wt %; and SiO$_2$ at 5.00 wt. %), by point E (La$_2$O$_3$ at 47.50 wt. %; Ga$_2$O$_3$ at 46.32 wt %; and SiO$_2$ at 6.18 wt. %), by point F (La$_2$O$_3$ at 47.50 wt. %; Ga$_2$O$_3$ at 46.00 wt %; and SiO$_2$ at 6.50 wt. %), and by point G (La$_2$O$_3$ at 47.98 wt. %; Ga$_2$O$_3$ at 46.00 wt %; and SiO$_2$ at 6.02 wt. %), these components are melted in a crucible, and a single crystal of La$_3$Ga$_5$SiO$_{14}$ is grown by pulling up from inside this crucible.

In addition, the substrate for the piezoelectric device of the present invention is one formed from the Langasite single crystal ingot of the present invention, and is characterized in being a single crystal set within the composition range delimited, as shown in FIG. 14, by point a (La$_2$O$_3$ at 47.98 wt. %; Ga$_2$O$_3$ at 46.32 wt %; and SiO$_2$ at 5.70 wt. %), by point b (La$_2$O$_3$ at 48.48 wt. %; Ga$_2$O$_3$ at 46.32 wt %; and SiO$_2$ at 5.20 wt. %), by point c (La$_2$O$_3$ at 48.49 wt. %; Ga$_2$O$_3$ at 47.49 wt %; and SiO$_2$ at 4.02 wt. %), by point d (La$_2$O$_3$ at 47.52 wt. %; Ga$_2$O$_3$ at 47.49 wt %; and SiO$_2$ at 4.99 wt. %), by point e (La$_2$O$_3$ at 47.52 wt. %; Ga$_2$O$_3$ at 46.32 wt %; and SiO$_2$ at 6.16 wt. %), by point f (La$_2$O$_3$ at 47.51 wt. %; Ga$_2$O$_3$ at 46.01 wt %; and SiO$_2$ at 6.48 wt. %), and by point g (La$_2$O$_3$ at 47.98 wt. %; Ga$_2$O$_3$ at 46.02 wt %; and SiO$_2$ at 6.00 wt. %).

In the manufacturing method for a substrate of a piezoelectric device and the substrate for the piezoelectric device, based on the experimental results described above, the respective composition ranges of the La$_2$O$_3$, Ga$_2$O$_3$, and SiO$_2$, which are the raw materials for La$_3$Ga$_5$SiO$_{14}$, are weight measured within the ranges described above, melted in a crucible, a single crystal of La$_3$Ga$_5$SiO$_{14}$ is grown by pulling up from this crucible. In addition, the La$_3$Ga$_5$SiO$_{14}$ is a single crystal in which the La$_2$O$_3$, Ga$_2$O$_3$, and SiO$_2$ are set within the composition ranges described above, and thereby a high quality La$_3$Ga$_5$SiO$_{14}$ single crystal is obtained in which the generation of secondary phases is extremely low, and at the same time a substrate is obtained that has a surface acoustic wave propagation velocity with little variation and a uniform center frequency.

Furthermore, it is preferable that in the manufacturing method for the substrate of the piezoelectric device of the present invention, the weight measurement is set within a composition range delimited, as shown in FIG. 14, by point A (La$_2$O$_3$ at 47.98 wt. %; Ga$_2$O$_3$ at 46.32 wt %; and SiO$_2$ at 5.70 wt. %), by point B (La$_2$O$_3$ at 48.50 wt. %; Ga$_2$O$_3$ at 46.32 wt %; and SiO$_2$ at 5.18 wt. %), by point C (La$_2$O$_3$ at 48.50 wt. %; Ga$_2$O$_3$ at 47.50 wt %; and SiO$_2$ at 4.00 wt. %), by point D (La$_2$O$_3$ at 47.50 wt. %; Ga$_2$O$_3$ at 47.50 wt %; and SiO$_2$ at 5.00 wt. %), and by point E (La$_2$O$_3$ at 47.50 wt. %; Ga$_2$O$_3$ at 46.32 wt %; and SiO$_2$ at 6.18 wt. %), these components are melted in a crucible, and a single crystal of La$_3$Ga$_5$SiO$_{14}$ is grown by pulling up from inside this crucible.

In addition, it is preferable that in the substrate for the piezoelectric device of the present invention, the weight measurement is set within a composition range delimited, as shown in FIG. 14, by point A (La$_2$O$_3$ at 47.98 wt. %; Ga$_2$O$_3$ at 46.32 wt %; and SiO$_2$ at 5.70 wt. %), by point B (La$_2$O$_3$ at 48.50 wt. %; Ga$_2$O$_3$ at 46.32 wt %; and SiO$_2$ at 5.18 wt. %), by point C (La$_2$O$_3$ at 48.50 wt. %; Ga$_2$O$_3$ at 47.50 wt %; and SiO$_2$ at 4.00 wt. %), by point D (La$_2$O$_3$ at 47.50 wt. %; Ga$_2$O$_3$ at 47.50 wt %; and SiO$_2$ at 5.00 wt. %), and by point E (La$_2$O$_3$ at 47.50 wt. %; Ga$_2$O$_3$ at 46.32 wt %; and SiO$_2$ at 6.18 wt. %), these components are melted in a crucible, and a single crystal of La$_3$Ga$_5$SiO$_{14}$ is grown by pulling up from inside this crucible.

Furthermore, in the manufacturing method of the substrate for the piezoelectric device of the present invention, this La$_3$Ga$_5$SiO$_{14}$ is preferably a single crystal set within the composition range delimited, as shown in FIG. 14, by point a (La$_2$O$_3$ at 47.98 wt. %; Ga$_2$O$_3$ at 46.32 wt %; and SiO$_2$ at 5.70 wt. %), by point b (La$_2$O$_3$ at 48.48 wt. %; Ga$_2$O$_3$ at 46.32 wt %; and SiO$_2$ at 5.20 wt. %), by point c (La$_2$O$_3$ at 48.49 wt. %; Ga$_2$O$_3$ at 47.49 wt %; and SiO$_2$ at 4.02 wt. %), by point d (La$_2$O$_3$ at 47.52 wt. %; Ga$_2$O$_3$ at 47.49 wt %; and SiO$_2$ at 4.99 wt. %), and by point e (La$_2$O$_3$ at 47.52 wt. %; Ga$_2$O$_3$ at 46.32 wt %; and SiO$_2$ at 6.16 wt. %).

In the manufacturing method for a substrate of a piezoelectric device and the substrate for the piezoelectric device, the respective composition ranges of the La$_2$O$_3$, Ga$_2$O$_3$, and $SiO_2$, which are the raw materials for $La_3Ga_5SiO_{14}$, are further weight measured to limit the ranges described above, melted in a crucible, a single crystal of $La_3Ga_5SiO_{14}$ is grown by pulling up from this crucible. In addition the $La_3Ga_5SiO_{14}$ is a single crystal in which the $La_2O_3$, $Ga_2O_3$, and $SiO_2$ are set within the composition ranges described above, and thereby the generation of secondary phases is suppressed, and the influence on growth caused by the vaporization of Ga can be extremely reduced due to the high composition ratio of the $Ga_2O_3$.

As a result of carrying out investigations of the manufacturing technology for Langasite single crystals, the present inventors were able to discover the composition conditions wherein defects and inclusions are almost completely absent. Therefore, the present invention is technology based on this knowledge, and uses the following structure in order to solve the problems described above.

Specifically, the manufacturing method for a substrate of a piezoelectric device of the present invention is one for a substrate of a piezoelectric device in which the Langasite single crystal of the present invention described above is grown and processed into a substrate of a piezoelectric device, and is characterized in that the weight measurement is set within a composition range wherein the $La_2O_3$ is set between 48.06 and 48.80 wt. %, the $Ga_2O_3$ is set between 45.25 and 46.60 wt. %, and the $SiO_2$ is set between 5.21 and 6.19 wt. %, they are melted in a crucible, and a single crystal of $La_3Ga_5SiO_{14}$ is grown by pulling up from within this crucible.

In addition, the substrate of a piezoelectric device of the present invention is a substrate of a piezoelectric device formed from the Langasite single crystal ingot of the present invention described above, and the $La_3Ga_5SiO_{14}$ is characterized in that the weight measurement is set within a composition range wherein the $La_2O_3$ is set between 48.06 and 48.80 wt. %, the $Ga_2O_3$ is set between 45.25 and 46.60 wt. %, and the $SiO_2$ is set between 5.21 and 6.19 wt. %, they are melted in a crucible, and a single crystal of $La_3Ga_5SiO_{14}$ is grown by pulling up from within this crucible.

In addition, the substrate of a piezoelectric device of the present invention is a substrate of a piezoelectric device formed from the Langasite single crystal ingot of the present invention described above, and the $La_3Ga_5SiO_{14}$ is characterized in being a single crystal having composition range wherein the $La_2O_3$ is set between 48.06 and 48.80 wt. %, the $Ga_2O_3$ is set between 45.25 and 46.60 wt. %, and the $SiO_2$ is set between 5.21 and 6.19 wt. %, they are melted in a crucible, and a single crystal of $La_3Ga_5SiO_{14}$ is grown by pulling up from within this crucible.

In the manufacturing method for a substrate of a piezoelectric device and the substrate for the piezoelectric device, based on the experimental results described above, the respective composition ranges of the $La_2O_3$, $Ga_2O_3$, and $SiO_2$, which are the raw materials for $La_3Ga_5SiO_{14}$, are weight measured within the ranges described above, melted in a crucible, a single crystal of $La_3Ga_5SiO_{14}$ is grown by pulling up from this crucible. In addition, the $La_3Ga_5SiO_{14}$ is a single crystal in which the $La_2O_3$, $Ga_2O_3$, and $SiO_2$ are set within the composition ranges described above, and thereby a high quality $La_3Ga_5SiO_{14}$ single crystal is obtained in which the occurrence of defects and inclusions in the crystal is extremely low, and at the same time a substrate is obtained that has a surface acoustic wave propagation velocity with little variation and a uniform center frequency.

Furthermore, it is preferable that in the substrate of a piezoelectric device of the present invention, the variation in the propagation velocity when the surface acoustic wave propagates in a certain direction on the surface that the device uses is equal to or less than 100 ppm.

In this substrate for the piezoelectric device, because the variation in this propagation velocity is equal to or less than 100 ppm, the homogeneity of the SAW filter properties can be improved.

The surface acoustic wave device of the present invention is characterized in forming an electrode that can transmit and receive a surface acoustic wave on the surface of the piezoelectric device substrate of the present invention described above.

By using the piezoelectric device substrate of the present invention, it is possible to obtain a surface acoustic wave device having a high quality, low variation in its properties, and high reliability.

BRIEF DESCRIPTION OF THE DRAWINGS

FIG. 4 is a drawing showing the results of measuring the contents of $La_2O_3$, $Ga_2O_3$, and $SiO_2$ at the locations shown in FIG. 2 and evaluating the homogeneity of the contents of the components in the ingot in a comparison between the respective measured results and the target contents.

FIG. 5 is a drawing showing the results of measuring the contents of $La_2O_3$, $Ga_2O_3$, and $SiO_2$ at the locations shown in FIG. 3 and evaluating the homogeneity of the contents of the components in the ingot in a comparison between the respective measured results and the target contents.

FIG. 6 is a state drawing showing the composition label of each Langasite single crystals grown by varying the composition and the presence or absence of the occurrence of growth striations in the piezoelectric device substrates in the second embodiment and the manufacturing method for the same.

FIG. 12 is a drawing showing experimental data showing the presence or absence of the occurrence of growth striations in the substrates where the piezoelectric device substrates are manufactured by varying the compositions of the La$_2$O$_3$, Ga$_2$O$_3$, and SiO$_2$ in the second embodiment.

FIG. 13 is a drawing showing the result of analyzing the composition in the longitudinal direction of the Langasite single crystal in the second embodiment.

FIG. 18 is a drawing showing experimental data showing the presence or absence of the occurrence of growth striations in the substrates where the piezoelectric device substrates are manufactured by varying the composition of the La$_2$O$_3$, Ga$_2$O$_3$, and SiO$_2$ in the third embodiment.

FIG. 19 is a drawing showing the result of analyzing the composition in the longitudinal direction of the Langasite single crystal in the third embodiment.

FIG. 20 is a drawing showing the result of analyzing the composition in the longitudinal direction of the Langasite single crystal in conventional example.

FIG. 26 is a table showing the occurrence of cracks (defects) and inclusions in the substrates where the piezoelectric device substrates are manufactured by varying the composition of the La$_2$O$_3$, Ga$_2$O$_3$, and SiO$_2$ in the fourth embodiment.

FIG. 27 is a table showing the result of analyzing the composition in the longitudinal direction of the Langasite single crystal in the fourth embodiment.

FIG. 28 is a table showing the result of analyzing the composition at each of the points (a, b, c, d) on the surface of the substrate (transverse direction of the crystal) by fluorescent X-ray analysis at the top section (wafer 1), middle section (wafer 2), and the bottom section (wafer 3) of the Langasite single crystal in the fourth embodiment.

DESCRIPTION OF THE PREFERRED EMBODIMENTS

Figure 1:
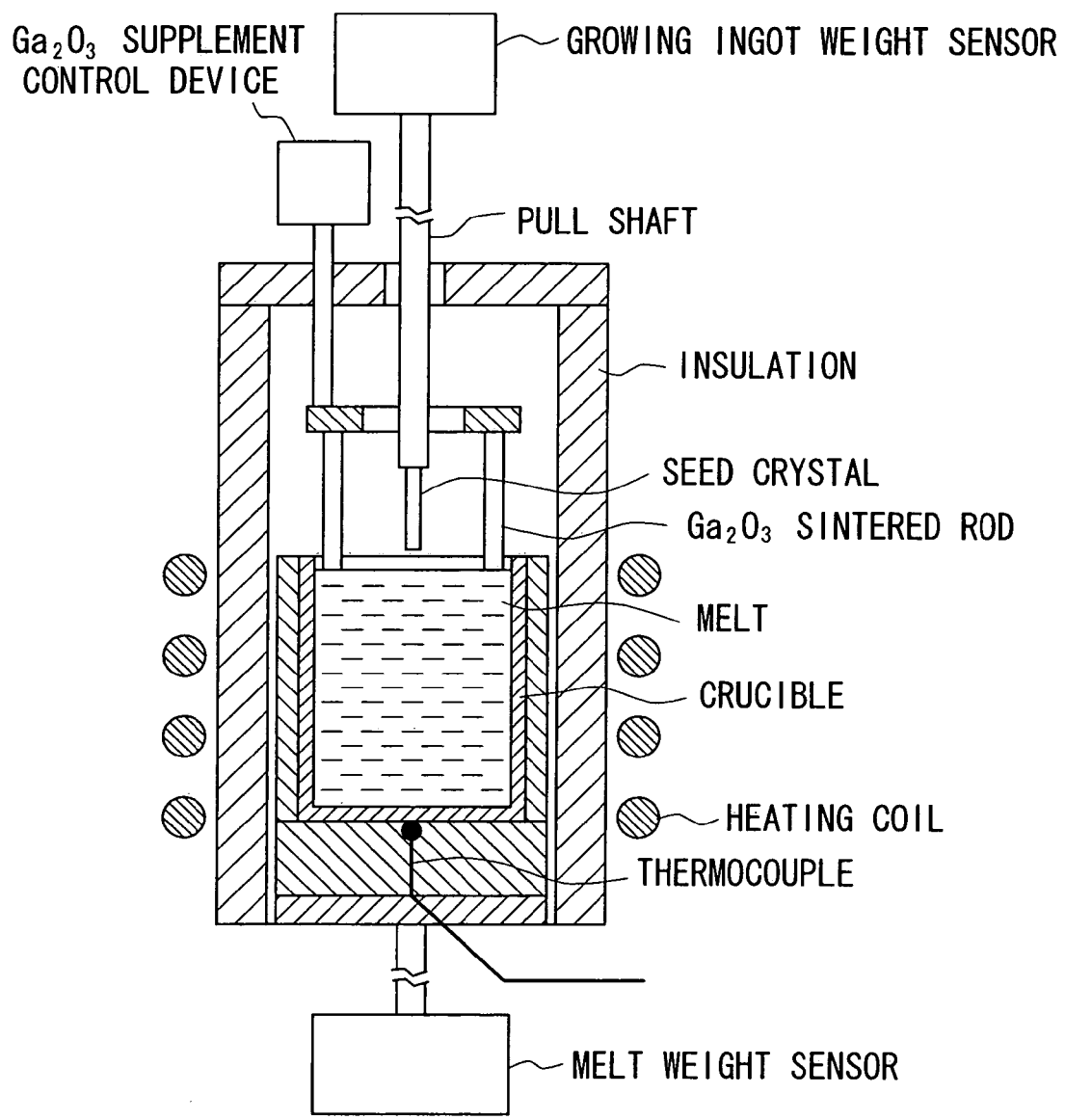
FIG. 1 is a schematic longitudinal cross-sectional drawing of a high frequency furnace for single crystal growth.

Below, the embodiments of the Langasite single crystal ingot having superior homogeneity in the contents of the components of the present invention, a manufacturing method for a substrate of a piezoelectric device, a substrate of a piezoelectric device, and a surface acoustic wave device using the same will be explained with reference to FIG. 1 through FIG. 5.

First Embodiment

The Langasite single crystal ingot of the present invention will be concretely explained using the examples.

As a raw material powder, a La$_2$O$_3$ powder, a Ga$_2$O$_3$ powder, and an SiO$_2$ powder, each having a purity of 99.99 wt. %, are prepared, these raw material powders are mixed in a target composition having a weight ratio of:

La$_2$O$_3$: 48%,
Ga$_2$O$_3$: 46%,
SiO$_2$: 6%, they are blended for 1 hour by a vibration mixer, and then they are press molded at a pressure of 0.01 ton/cm$^2$ into pellets that have an external diameter of 100 mm and a thickness of 60 mm. These pellets are sintered in an electric furnace maintained at 1200° C. for 1 hour, and then the sintered pellets are charged into an iridium crucible having a diameter of 15 cm in a radio frequency heating furnace for single crystal growth. The crucible is shown in the schematic longitudinal cross-sectional drawing in FIG. 1. A melt is made by melting these pellets using radio frequency heating coils where an alumina and zirconia insulating material is disposed along the outer circumference of this crucible. In this state, a Langasite seed crystal mounted on the distal end of the pull shaft is brought into contact with the melt surface in the crucible, and while rotating this pull shaft at a predetermined velocity, the growth of the single crystal ingot is started by pulling it up at a predetermined velocity. At the same time, the weight of the melt and the growth ingot in the crucible are each measured by a weight sensor continuously or discontinuously during the ingot growth. In this case, the sum of the measured weights of the melt and the growth ingot becomes deficient with respect to the weight of the melt in the crucible before the start of the ingot growth, that is, with respect to the melt weight having the target contents described above, due to the vaporization from the melt surface. This deficiency is supplemented by sequentially immersing in the melt surface Ga$_2$O$_3$ sintered rods having a diameter of 1 cm and a length of 20 cm suspended at three equal intervals along the inside of the upper end of the crucible above the surface of the melt. In this manner, a large diameter Langasite single crystal ingot (below, referred to as the "ingot of the present invention") having a diameter in the straight part of 100 mm and a length in the straight part 120 mm is manufactured by carrying out ingot growth while supplementing the Ga$_2$O$_3$ using the Ga$_2$O$_3$ sintered rods such that the total of the weights of the melt in the crucible and the growth ingot always conform to the weight of the melt in the crucible before the start of the growth.

In addition, with the object of comparison, a large diameter conventional Langasite single crystal ingot (below, referred to as the "conventional ingot") was manufactured under identical conditions, with the exception that the supplementation of the $Ga_2O_3$ on the melt surface using the $Ga_2O_3$ sintered rods described above was not carried out during the ingot growth.

Figure 2:
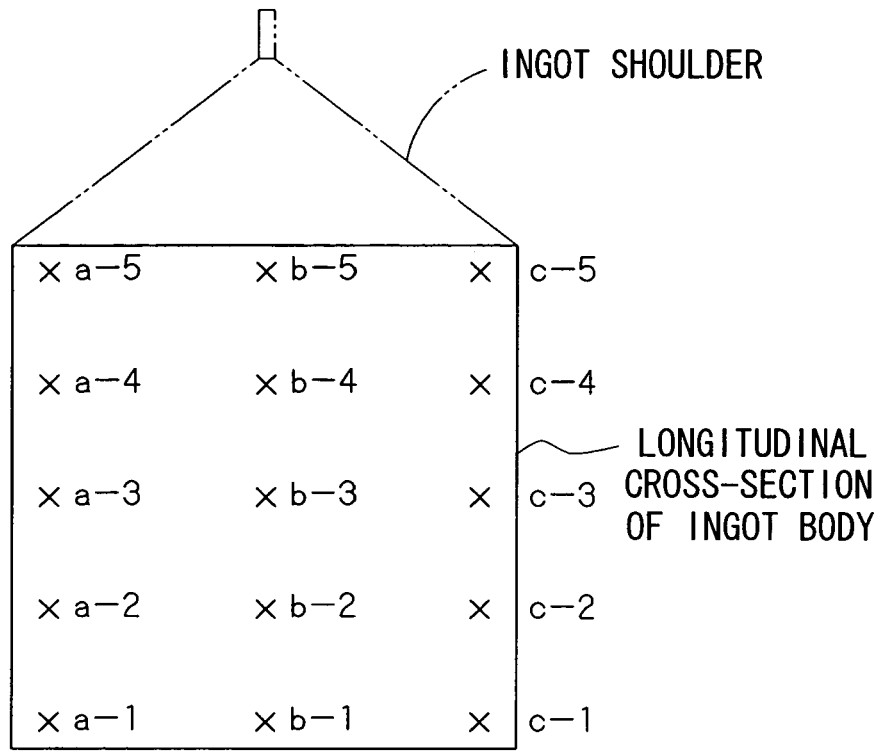
FIG. 2 is a drawing showing the measurement locations of the contents of the components in the longitudinal cross-section that includes the center line in the longitudinal direction of the ingot straight part.
Figure 3:
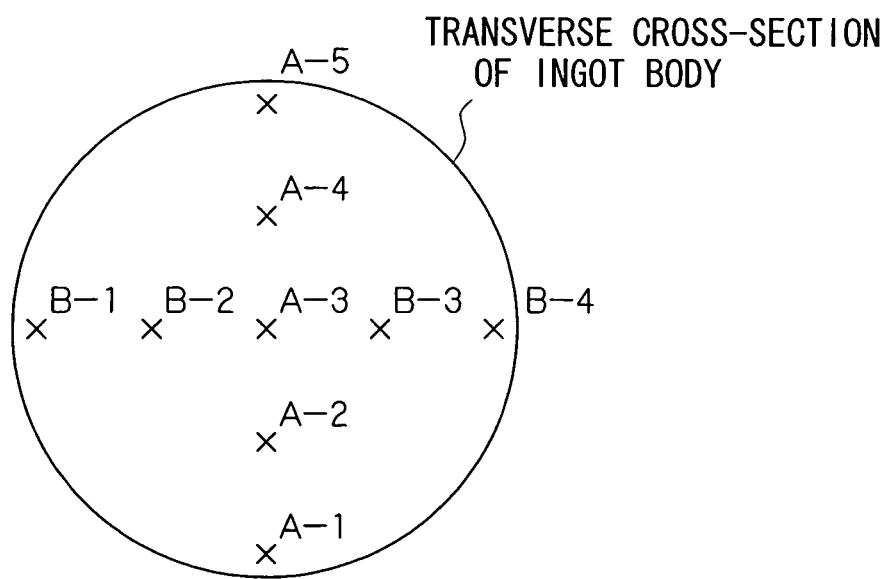
FIG. 3 is a drawing showing the measurement locations of the contents of the components in the transverse cross-section of the top section and the bottom section in the longitudinal direction of the ingot straight part.

In the straight part, which excludes the shoulder part, of the ingot of the present invention and the conventional ingot, the incorporated content of $La_2O_3$, $Ga_2O_3$, and $SiO_2$ at the locations shown in FIG. 2 and FIG. 3 in an arbitrary longitudinal cross-section that includes the center line in the longitudinal direction and in an arbitrary transverse cross-section of the upper section and lower section in the longitudinal direction were measured, and the homogeneity in the ingot of the contents of the components was evaluated in a comparison between the respective measured results and the target contents. The results of the measurements are shown in the tables shown in FIG. 4 and FIG. 5.

Second Embodiment

The second embodiment of the present invention is explained with reference to FIG. 6 to FIG. 13.

To manufacture the piezoelectric device substrate of the present embodiment and the surface acoustic wave device, first the raw materials are weight measured within the composition range shown in FIG. 6, or specifically, within the composition range delimited by point A ($La_2O_3$ at 47.81 wt. %; $Ga_2O_3$ at 46.50 wt %; and $SiO_2$ at 5.69 wt. %), by point B ($La_2O_3$ at 47.97 wt. %; $Ga_2O_3$ at 46.26 wt %; and $SiO_2$ at 5.77 wt. %), and by point C ($La_2O_3$ at 48.04 wt. %; $Ga_2O_3$ at 46.50 wt %; and $SiO_2$ at 5.46 wt. %).

Next, these raw materials are blended for 1 hour in a vibration mixer and are formed into pellets having an external diameter of 100 mm×60 mm. Next, the pellets are sintered for 1 hour in air at a temperature of 1200° C. in an electric furnace.

Figure 7:
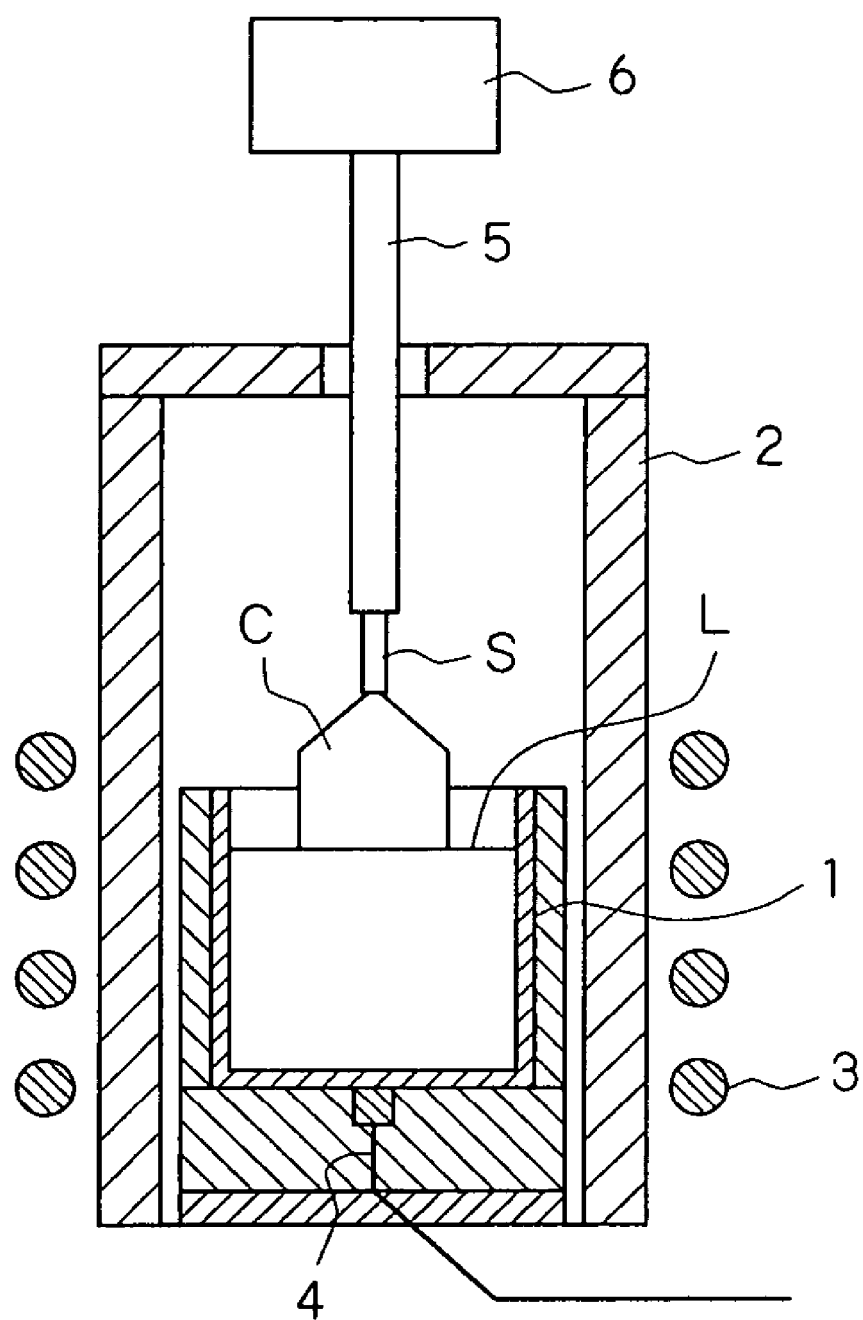
FIG. 7 is a schematic cross-sectional diagram showing the growth by pulling-up according to the CZ method in the manufacturing method for the piezoelectric device in the second embodiment.

As shown in FIG. 7, the growth of the crystal is carried out in a radio frequency heating furnace for crystal growth by using the iridium crucible 1. An alumina and zirconia insulating material 2 is provided around and above the crucible 1 to form a hot zone. On the outside of the insulating material 2, a radio frequency work coil 3 for heating is disposed. At the bottom of the crucible 1, a thermocouple 4 is disposed.

When performing growth, the sintered pellets are charged in the crucible 1, and is heated and melted to form a melt L having a predetermined temperature. In addition, the seed crystal S of Langasite ($La_3Ga_5SiO_{14}$) is fixed to the pull shaft 5, and the Langasite single crystal C is grown from the melt L at a predetermined rotation rate and pulling-up velocity. Automatic diameter control is carried out using a weight change signal for the crystal detected by a weight sensor 6 attached to the pull shaft 5.

The Langasite single crystal C (diameter=85 mm; length of the straight part=190 mm) grown in this manner becomes a single crystal within a composition range identical to the composition range at the time of the weight measurement. That is, as shown in FIG. 6, when single crystals are grown by the weight measurement within the above composition range, the composition of the point A results in a composition shown by point a ($La_2O_3$ at 47.82 wt. %, $Ga_2O_3$ at 46.50 wt. %, and $SiO_2$ at 5.68 wt. %), the composition of the point B results in a composition shown by point b ($La_2O_3$ at 47.97 wt. %, $Ga_2O_3$ at 46.27 wt. %, and $SiO_2$ at 5.76 wt. %), and the composition of the point C results in a composition shown by point c ($La_2O_3$ at 48.03 wt. %, $Ga_2O_3$ at 46.49 wt. %, and $SiO_2$ at 5.48 wt. %). Therefore, this single crystal is a single crystal within the composition range delimited by points a to c shown in FIG. 6.

Figure 8:
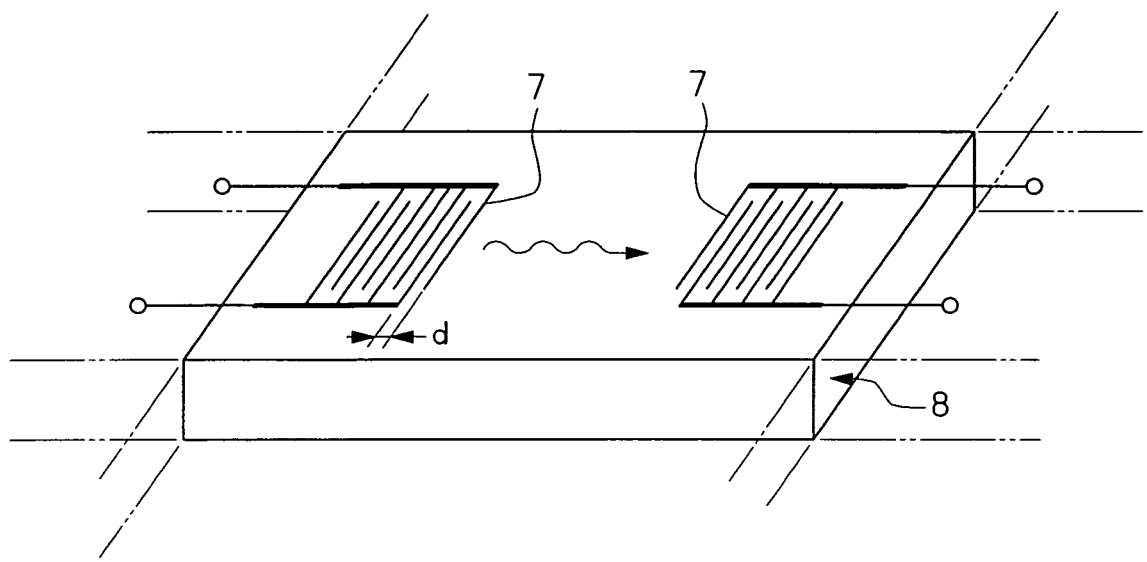
FIG. 8 is a perspective drawing showing the surface acoustic wave device of the second embodiment.

Next, this Langasite single crystal C is sliced and undergoes processing into a substrate of a piezoelectric device. Then, as shown in FIG. 8, a SAW filter (surface acoustic wave device) 8 is fabricated by forming an interdigital transducer (cord electrode, interdigital electrode) 7 on the surface of this substrate of a piezoelectric device.

Moreover, the variation of the surface acoustic wave velocity (the propagation velocity when the surface acoustic wave is propagated across the surface, that is, the propagation velocity when propagating in a certain direction (the facing direction of the interdigital transducers 7) that the device is using) of the substrate for the piezoelectric device described above becomes equal to or less than 100 ppm.

Example of the Second Embodiment

Next, the manufacturing method for a substrate of a piezoelectric device, a substrate of a piezoelectric device, and a surface acoustic wave device using the same will be concretely explained with reference to FIG. 6 and FIG. 9 through FIG. 13 using examples.

In the manufacturing method described above, the piezoelectric device substrate was manufactured by varying the composition of the $La_2O_3$, $Ga_2O_3$, and $SiO_2$, and the experimental data showing the presence or absence of the occurrence of growth striations in these substrates is shown in FIG. 12 and FIG. 6. The marks in FIG. 6 denote the presence of growth striations by ◆, and the absence by ◇. Note that there was no generation of secondary phases in each of the experimental samples (A through C, and ① to ⑤). In addition, the X point in FIG. 6 is the case of a single crystal grown based on the conventional stoichiometric composition ($La_2O_3$ at 48.04 wt. %, $Ga_2O_3$ at 46.06 wt. %, and $SiO_2$ at 5.91 wt. %), and point Y is the case of a single crystal grown based on the composition disclosed in the report that appeared in J. Crystal Growth cited above ($La_2O_3$ at 47.99 wt. %, $Ga_2O_3$ at 46.30 wt. %, and $SiO_2$ at 5.71 wt. %). Moreover, the composition of point D, which is in the composition range delimited by point A and point C ($La_2O_3$ at 47.94 wt. %, $Ga_2O_3$ at 46.42 wt. %, and $SiO_2$ at 5.64 wt. %), also similarly reliably grows a Langasite single crystal. The single crystal grown based on the composition of this point D attains the composition of point d ($La_2O_3$ at 47.94 wt. %, $Ga_2O_3$ at 46.43 wt. %, and $SiO_2$ at 5.63 wt. %).

As shown in FIG. 12 and FIG. 6, it can be understood that in contrast to the good quality crystals obtained without the occurrence of growth striations in the test samples A to D manufactured using the compositions within the composition range described above, growth striations occur for the test samples (test sample numbers ① to ⑤, and X and Y) set outside the composition ranges described above.

Figure 9:
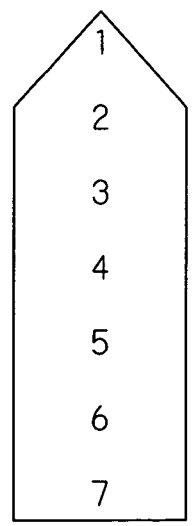
FIG. 9 is a schematic frontal drawing of the single crystal showing the measurement locations in the longitudinal direction of the crystal in the piezoelectric device in the second embodiment and the manufacturing method for the same.
Figure 10:
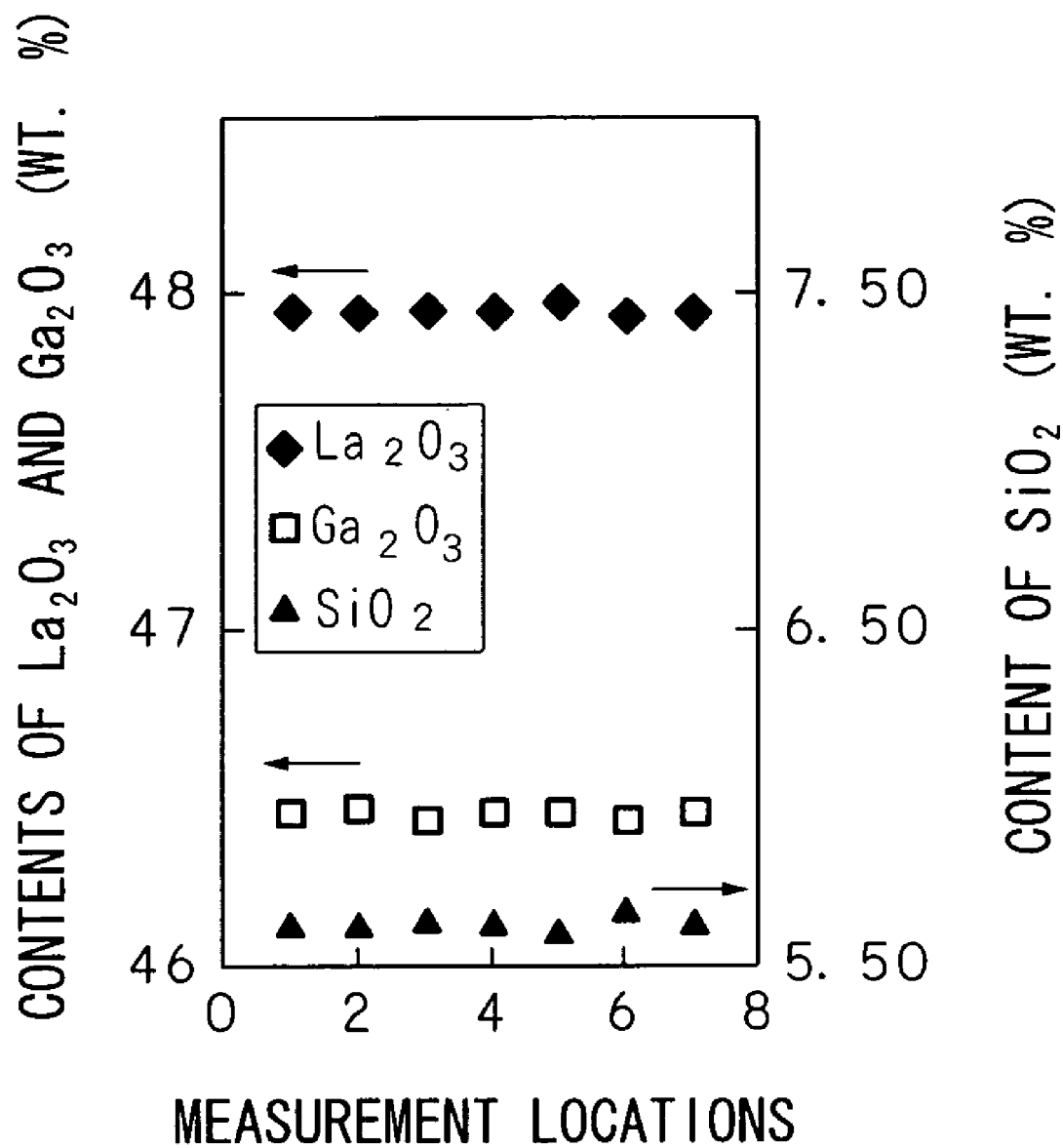
FIG. 10 is a graph showing the contents of each of the raw materials for the measured locations in the longitudinal direction of the crystal in the piezoelectric device substrate in the second embodiment and the manufacturing method for the same.

In addition, among the composition ranges described above, raw materials were weight measured with a composition having $La_2O_3$ at 47.93 wt. %, $Ga_2O_3$ at 46.45 wt. %, and $SiO_2$ at 5.62 wt. %, pellets were fabricated and charged into the crucible 1, and a Langasite single crystal having a diameter of 85 mm and a length of 190 mm at the straight part was grown. Then the composition in the longitudinal direction of the Langasite single crystal was analyzed using ICP (Inductive Coupled Plasma) analysis. As a result, as shown in FIG. 13 and FIGS. 9 and 10, the contents of each of the components matched the charged composition at an error within ±0.02%. Therefore, it was determined that a crystal having a good homogeneity through the top section, the middle section, and the bottom section was obtained. Furthermore, this Langasite single crystal did not exhibit the generation of secondary phases.

Next, wafers were fabricated from a 50° rotated Y-cut Langasite single crystal of the embodiment described above. In order to investigate the variation in the surface acoustic wave velocity (propagation velocity) on the surface of these wafers, an aluminum interdigital transducer 7 was formed by sputtering to fabricate the SAW filter 8 of the embodiment described above. In addition, the center frequency $f_c$ of the SAW filter 8 was measured using a net analyzer. In these measurements, an AC signal was applied to the input terminal of the SAW filter, the output signal from the output terminal was measured, and the output signal of the filter and the frequency characteristic of the relative amplitude of the input signal were obtained by frequency scanning.

The center frequency $f_c$ is the frequency at the pass band center point where the transmission loss from the peak value of this frequency characteristic becomes −10 dB. Here, the surface acoustic wave velocity v is obtained by the relationship v=fc·2d, where 2d is the cycle of the interdigital transducer (cord electrode) 7 of the SAW filter 8, and the precision of the dimensions thereof was confirmed by electron microscopy. In this manner, it was possible to find the surface acoustic wave velocity from the center frequency of the SAW filter, and investigate the variation in the substrate surface of the surface acoustic wave velocity.

Figure 11:
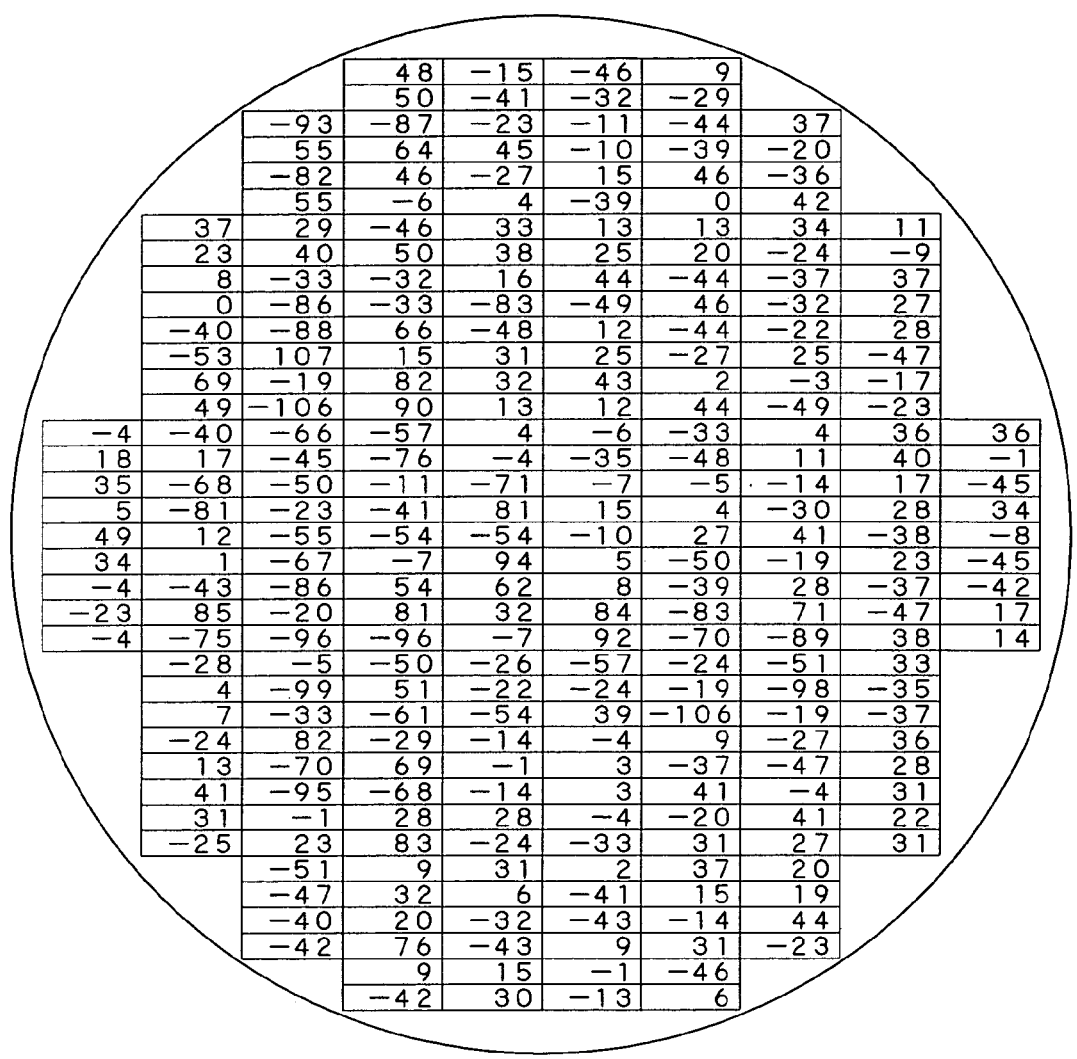
FIG. 11 is a graph showing the variation in the substrate surface of the SAW filter of the SAW acoustic velocity in the surface acoustic wave device in the second embodiment.

Furthermore, the overall variation in the substrate from the top section, the middle section, to the bottom section of the crystal was also investigated. As a result, as shown in FIG. 11, the variation in the surface acoustic wave velocity was equal to or less than 100 ppm, and an improvement in the homogeneity of the properties of the SAW filter due to the homogeneity of the composition of the crystal was confirmed.

Moreover, in order to investigate the influence that the change in the composition of the crystal had on the variation in the surface acoustic wave velocity, a SAW filter was fabricated as a comparative example by processing a conventional crystal grown based on the stoichiometric composition ratio into a substrate of a piezoelectric device, similar to the embodiment. It is noted that in these experiments, only the transparent upper part of the crystal was used. When measuring the center frequency of this SAW filter, the variation in the surface acoustic wave velocity in the direction of the growth of the crystal was 400 ppm, resulting in a variation that was excessive for use as an elastic wave element.

That is, in the present embodiment, the $La_2O_3$, $Ga_2O_3$, and $SiO_2$, which are the raw materials of the Langasite, were each weight measured within the ranges described above, melted in the crucible 1, and a Langasite single crystal C was grown by pulling up from inside the crucible. Thus, a high quality Langasite single crystal having an extremely low occurrence of growth striations and having a uniform composition at least in the longitudinal direction and the transverse direction (wafer surface) was obtained, and at the same time, a substrate having a uniform propagation velocity was obtained. In addition, by obtaining a substrate of a piezoelectric device having a variation in the surface acoustic wave velocity equal to or less than 100 ppm, the homogeneity of the SAW filter was improved by using this substrate, and it was possible to obtain a high quality device at a high yield.

Third Embodiment

Next, the manufacturing method for a substrate of a piezoelectric device, a substrate of a piezoelectric device, and a surface acoustic wave device using the same of the third embodiment will be explained with reference to FIG. 14 through FIG. 20.

Figure 14:
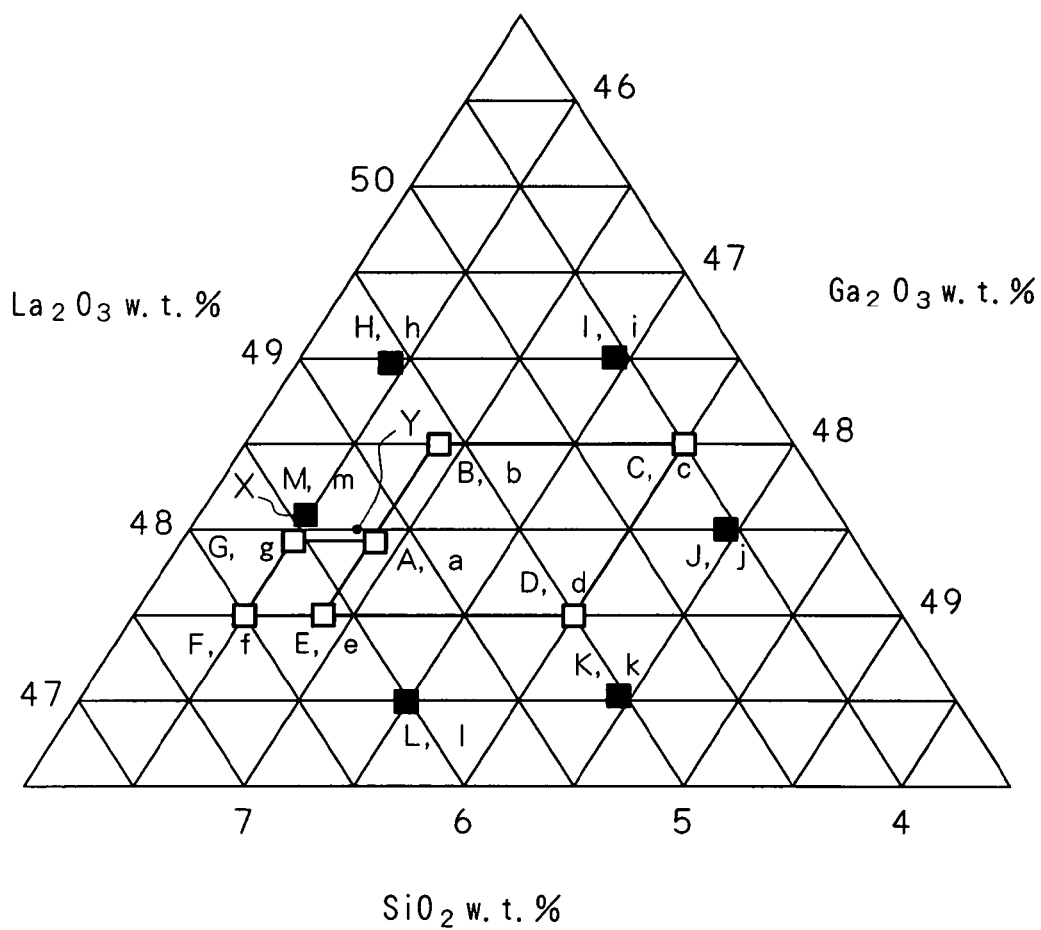
FIG. 14 is a state showing the composition labels of each of the Langasite single crystals grown by varying the composition and the generation of secondary phases in the piezoelectric device substrates in the third embodiment and the manufacturing method for the same.

In manufacturing the substrate of a piezoelectric device and the surface acoustic wave device of the present embodiment, the raw materials were weight measured using the first composition range shown in FIG. 14, that is, by point A ($La_2O_3$ at 47.98 wt. %; $Ga_2O_3$ at 46.32 wt %; and $SiO_2$ at 5.70 wt. %), by point B ($La_2O_3$ at 48.50 wt. %; $Ga_2O_3$ at 46.32 wt %; and $SiO_2$ at 5.18 wt. %), by point C ($La_2O_3$ at 48.50 wt. %; $Ga_2O_3$ at 47.50 wt %; and $SiO_2$ at 4.00 wt. %), by point D ($La_2O_3$ at 47.50 wt. %; $Ga_2O_3$ at 47.50 wt %; and $SiO_2$ at 5.00 wt. %), by point E ($La_2O_3$ at 47.50 wt. %; $Ga_2O_3$ at 46.32 wt %; and $SiO_2$ at 6.18 wt. %), by point F ($La_2O_3$ at 47.50 wt. %; $Ga_2O_3$ at 46.00 wt %; and $SiO_2$ at 6.50 wt. %), and by point G ($La_2O_3$ at 47.98 wt. %; $Ga_2O_3$ at 46.00 wt %; and $SiO_2$ at 6.02 wt. %).

Moreover, in these composition ranges, the composition ranges wherein the $La_2O_3$ exceeded 47.98 wt. % and the $Ga_2O_3$ was less than 46.32 wt. % were excluded from the composition ranges wherein the $La_2O_3$ was from 47.50 wt. % to 48.50 wt. %, the $Ga_2O_3$ was from 46.00 wt. % to 47.50 wt. %, and the $SiO_2$ was from 4.00 wt. % to 6.50 wt. %.

Next, pellets like those in the second embodiment were fabricated and a Langasite single crystal was grown.

The Langasite single crystal grown in this manner became a single crystal having a composition range identical to the composition range during the weight measurement. That is, when single crystals are grown by the weight measurement within the above composition range, as shown in FIG. 14, the composition of the point A results in a composition shown by point a ($La_2O_3$ at 47.98 wt. %; $Ga_2O_3$ at 46.32 wt %; and $SiO_2$ at 5.70 wt. %), the composition of the point B results in a composition shown by point b ($La_2O_3$ at 48.48 wt. %; $Ga_2O_3$ at 46.32 wt %; and $SiO_2$ at 5.20 wt. %), the composition of the point C results in a composition shown by point c ($La_2O_3$ at 48.49 wt. %; $Ga_2O_3$ at 47.49 wt %; and $SiO_2$ at 4.02 wt. %), the composition of the point D results in a composition shown by point d ($La_2O_3$ at 47.52 wt. %; $Ga_2O_3$ at 47.49 wt %; and $SiO_2$ at 4.99 wt. %), the composition of the point E results in a composition shown by point e ($La_2O_3$ at 47.52 wt. %; $Ga_2O_3$ at 46.32 wt %; and $SiO_2$ at 6.16 wt. %), the composition of the point F results in a composition shown by point f ($La_2O_3$ at 47.51 wt. %; $Ga_2O_3$ at 46.01 wt %; and $SiO_2$ at 6.48 wt. %), and the composition of the point G results in a composition shown by point g ($La_2O_3$ at 47.98 wt. %; $Ga_2O_3$ at 46.02 wt %; and $SiO_2$ at 6.00 wt. %). Therefore, this single crystal is a single crystal within the composition ranges delimited by points a through g shown in FIG. 14. In the Langasite single crystal within these composition ranges, there was almost no occurrence of secondary phases.

Next, from these Langasite single crystals, SAW filters (surface acoustic wave devices) were fabricated identically to those the second embodiment.

Moreover, the variation of the surface acoustic wave velocity (the propagation velocity when the surface acoustic wave is propagated across the surface, that is, the propagation velocity when propagating in a certain direction (the facing direction of the interdigital transducers 7) that the device is using) of the substrate for the piezoelectric device described above becomes equal to or less than 100 ppm.

Example of the Third Embodiment

Next, the manufacturing method for a substrate of a piezoelectric device, a substrate of a piezoelectric device, and a surface acoustic wave device using the same of the present embodiment will be concretely explained with reference to FIG. 14 and FIG. 4 through FIG. 20 using examples.

In the manufacturing method described above, the piezoelectric device substrate was manufactured by varying the composition of the $La_2O_3$, $Ga_2O_3$, and $SiO_2$, and the experimental data showing the presence or absence of the occurrence of growth striations in these substrates is shown in FIG. 18 and FIG. 14. Moreover, the marks in FIG. 14 denote the presence of secondary phases by ■, and the absence by ☐. In addition the X point in FIG. 14 is the case of a single crystal grown based on the conventional stoichiometric composition ($La_2O_3$ at 48.04 wt. %, $Ga_2O_3$ at 46.06 wt. %, and $SiO_2$ at 5.91 wt. %), and point Y is the case of a single crystal grown based on the composition disclosed in the report that appeared in J. Crystal Growth cited above ($La_2O_3$ at 47.99 wt. %, $Ga_2O_3$ at 46.30 wt. %, and $SiO_2$ at 5.71 wt. %).

As shown in FIG. 18 and FIG. 14, it can be understood that a high quality crystal was obtained without the generation of secondary phases in the test sample letters from A to G, manufactured by using the compositions within the composition ranges described above, while in contrast the test samples outside the ranges described above (test sample letters from H to M) exhibited the generation of secondary phases.

Figure 15:
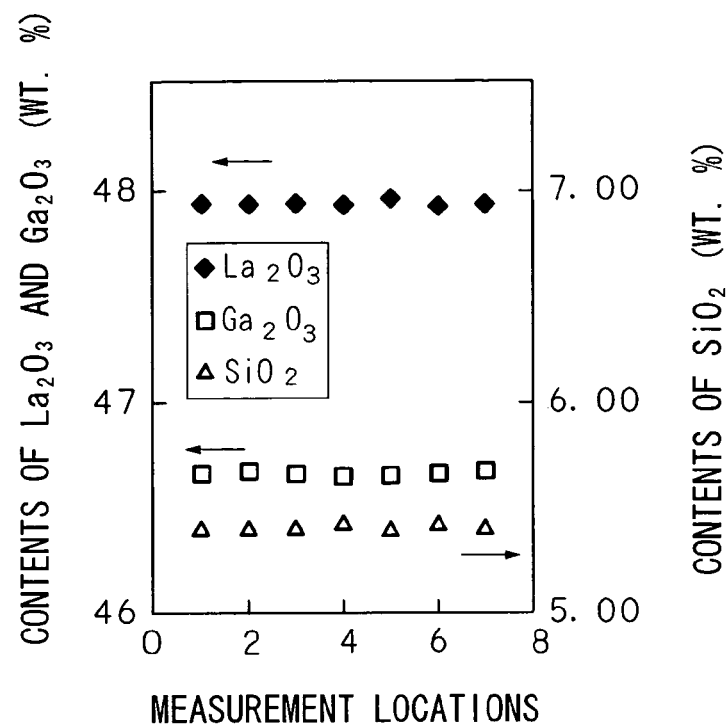
FIG. 15 is a graph showing the contents of each of the raw materials for the measured locations in the longitudinal direction of the crystal in the piezoelectric device substrate in the third embodiment and the manufacturing method for the same.

In addition, among the composition ranges described above, raw materials were weight measured having a composition wherein the $La_2O_3$ was 47.93 wt. %, the $Ga_2O_3$ was 46.66 wt. %, and the $SiO_2$ was 5.41 wt. %, pellets were fabricated and charged in the crucible 1, and a Langasite single crystal C having a diameter of 85 mm and a length of 190 mm in the straight part was grown. Then the composition in the longitudinal direction of the Langasite single crystal was analyzed using ICP (Inductive Coupled Plasma) analysis. As a result, as shown in FIG. 19 and FIGS. 9 and 15, the contents of each of the components matched the charged composition at an error within ±0.02%. Therefore, it was determined that a crystal having a good homogeneity through the top section, the middle section, and the bottom section was obtained. Furthermore, this Langasite single crystal did not exhibit the generation of secondary phases.

Figure 16:
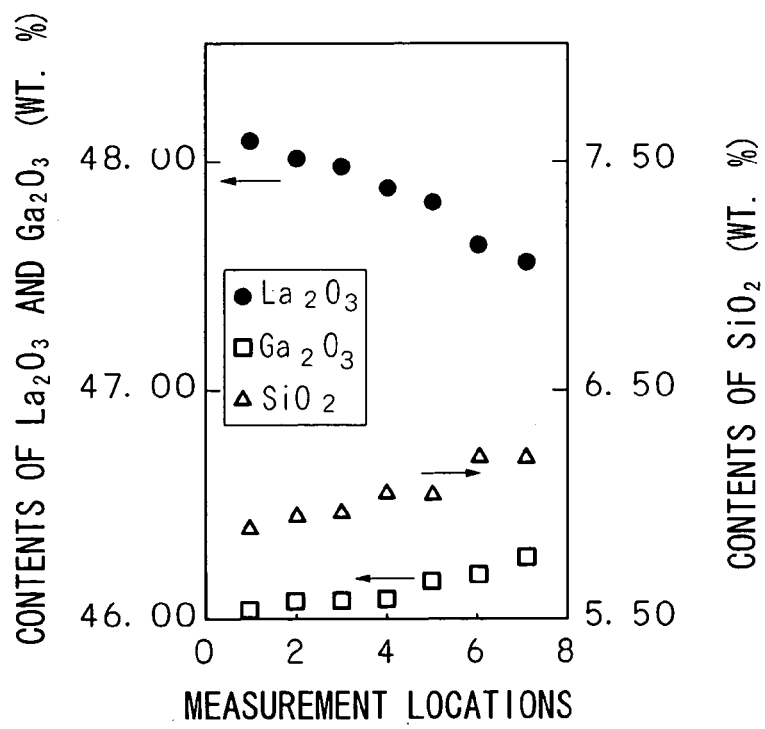
FIG. 16 is a graph showing the contents of each of the raw materials for the measured locations in the longitudinal direction of the crystal of the piezoelectric device in the conventional example and the manufacturing method for the same.

Moreover, as shown in FIG. 20 and FIG. 16, raw materials were weight measured based on the conventional stoichiometric composition ratio, and a crystal was grown as a comparative example identically to that in the embodiment described above. It is noted that in the formation step of the top section (the shoulder part) of this crystal, secondary phases occurred. In addition, while the top section of this crystal was transparent, inclusions occurred in the bottom section, and the transparency was bad. In addition, the fluctuation in the composition from the top section to the bottom section of the crystal was ±0.5% of the target contents. The bottom section of this crystal cannot be used as an elastic wave element.

Next, wafers were fabricated from a 50° rotated Y-cut Langasite single crystal of the embodiment described above. In order to investigate the variation in the surface acoustic wave velocity (propagation velocity) on the surface of these wafers, the SAW filter of the embodiment described above was fabricated identically to that of the second embodiment, and the center frequency $f_c$ of the SAW filter was measured using net analyzer.

Figure 17:
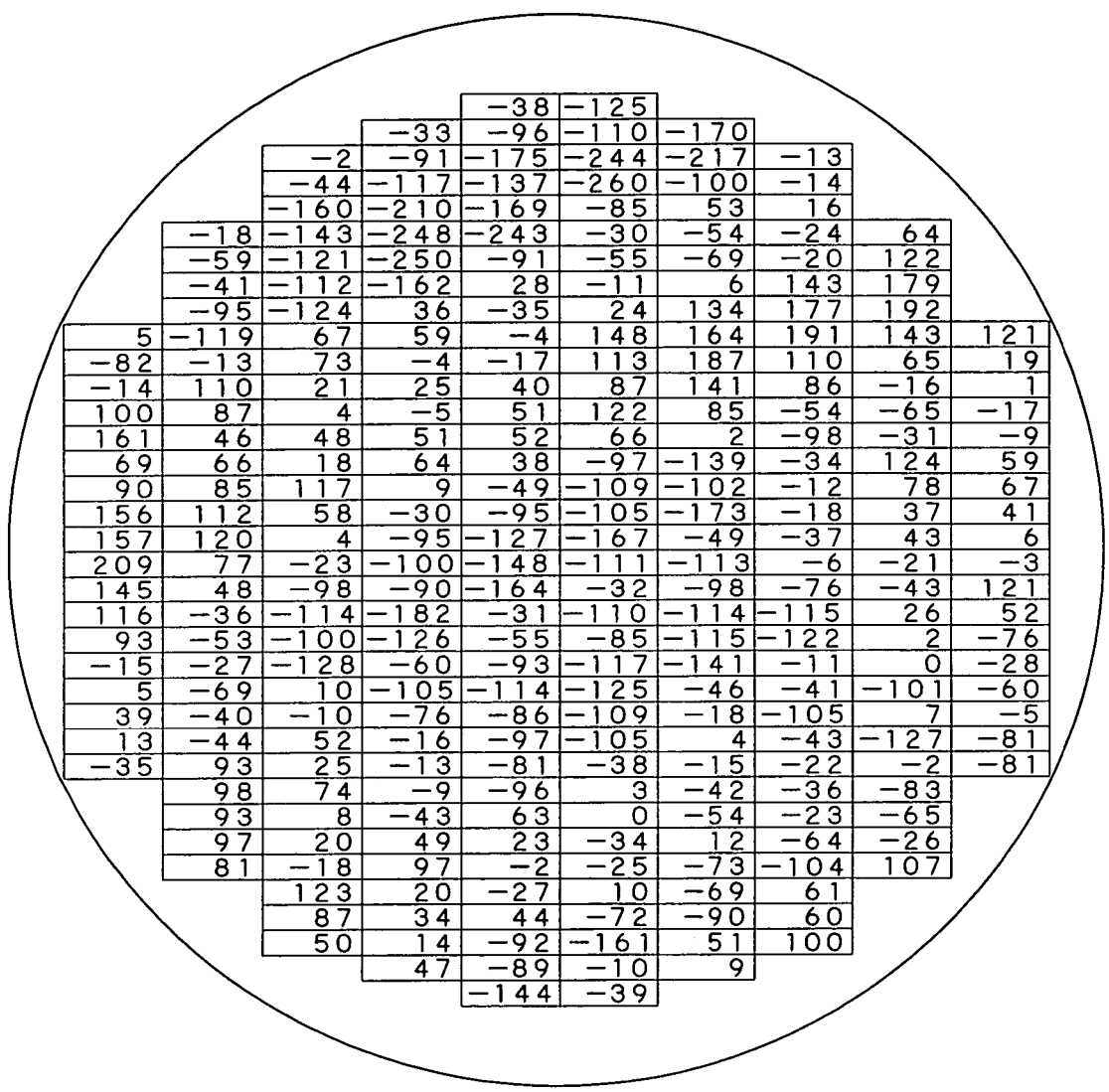
FIG. 17 is a graph showing the variation in the surface of the substrate of the SAW filter of the SAW acoustic velocity in the surface acoustic wave device in the third embodiment.

Furthermore, the overall variation in the substrate from the top section, the middle section, to the bottom section of the crystal was also investigated. As a result, as shown in FIG. 17, the variation in the surface acoustic wave velocity was equal to or less than 100 ppm, and an improvement in the homogeneity of the properties of the SAW filter due to the homogeneity of the composition of the crystal was confirmed.

Specifically, in the present embodiment, the $La_2O_3$, $Ga_2O_3$, and $SiO_2$, which are the raw materials of the Langasite, were each weight measured within the ranges described above, melted in the crucible 1, and a Langasite single crystal C was grown by pulling up from inside the crucible. Thus, a high quality Langasite single crystal having an extremely low occurrence of growth striations and having a uniform composition in the longitudinal direction and the transverse direction (wafer surface) was obtained, and at the same time, a substrate having a uniform propagation velocity was obtained. In addition, by obtaining a substrate of a piezoelectric device having a variation in the surface acoustic wave velocity equal to or less than 100 ppm, the homogeneity of the SAW filter was improved by using this substrate, and it was possible to obtain a high quality device at a high yield.

Moreover, in manufacturing the substrate of a piezoelectric device and the surface acoustic wave device when taking into consideration the volatility of Ga, the raw materials were weight measured using the second composition range shown in FIG. 14, that is, delimited by point A ($La_2O_3$ at 47.98 wt. %; $Ga_2O_3$ at 46.32 wt %; and $SiO_2$ at 5.70 wt. %), by point B ($La_2O_3$ at 48.50 wt. %; $Ga_2O_3$ at 46.32 wt %; and $SiO_2$ at 5.18 wt. %), by point C ($La_2O_3$ at 48.50 wt. %; $Ga_2O_3$ at 47.50 wt %; and $SiO_2$ at 4.00 wt. %), by point D ($La_2O_3$ at 47.50 wt. %; $Ga_2O_3$ at 47.50 wt %; and $SiO_2$ at 5.00 wt. %), and by point E ($La_2O_3$ at 47.50 wt. %; $Ga_2O_3$ at 46.32 wt %; and $SiO_2$ at 6.18 wt. %).

In this manner, growth by pulling up was carried out in the manner described above by weight measuring that limits the composition range, the Langasite single crystal that is pulled up is processed into a substrate of a piezoelectric device, and the SAW device is fabricated identically as described above on the substrate for the piezoelectric device.

Specifically, when the composition ratio of the $Ga_2O_3$ is lower than 46.32 wt. %, the change in the composition ratio due to the vaporization of Ga can no longer be ignored, and this influences the growth by pulling up. However, by increasing the composition ratio of the $Ga_2O_3$ in the second composition range described above by further limiting, not only is there a suppression of the generation of secondary phases, but also the influence on the growth due to the vaporization of the Ga is almost completely eliminated, and a stable growth can be carried out. In such a substrate of a piezoelectric device, the variation of the composition ratio is made smaller, and in the SAW device that uses this substrate, more stable characteristics can be obtained.

Fourth Embodiment

Next, the manufacturing method for a substrate of a piezoelectric device, a substrate of a piezoelectric device, and a surface acoustic wave device using the same of the fourth embodiment will be explained with reference to FIG. 21 through FIG. 28.

To manufacture the piezoelectric device substrate of the present embodiment and the surface acoustic wave device, first the raw materials are weight measured within the composition ranges in which $La_2O_3$ was set from 48.06 to 48.80 wt. %, $Ga_2O_3$ was set from 45.25 to 46.60, and $SiO_2$ was set from 5.21 to 6.19.

Next, the pellets were fabricated identically to those the second embodiment and Langasite single crystals were grown.

The Langasite single crystals grown in this manner were single crystals within a composition range in which the $La_2O_3$ was from 48.06 to 48.80 wt. %, the $Ga_2O_3$ was from 45.25 to 46.60 wt. %, and the $SiO_2$ was from 5.21 to 6.19 wt. %.

Next, a SAW filter (surface acoustic wave device) was fabricated identically to that in the second embodiment from this Langasite single crystal.

The variation of the surface acoustic wave velocity (the propagation velocity when the surface acoustic wave is propagated across the surface, that is, the propagation velocity when propagating in a certain direction (the facing direction of the interdigital transducers 7) that the device is using) of the substrate for the piezoelectric device described above becomes equal to or less than 100 ppm.

Example of the Fourth Embodiment

Next, the manufacturing method for a substrate of a piezoelectric device, a substrate of a piezoelectric device, and a surface acoustic wave device using the same according to the present embodiment will be concretely explained with reference to FIGS. 21 to 28 using examples.

Figure 21:
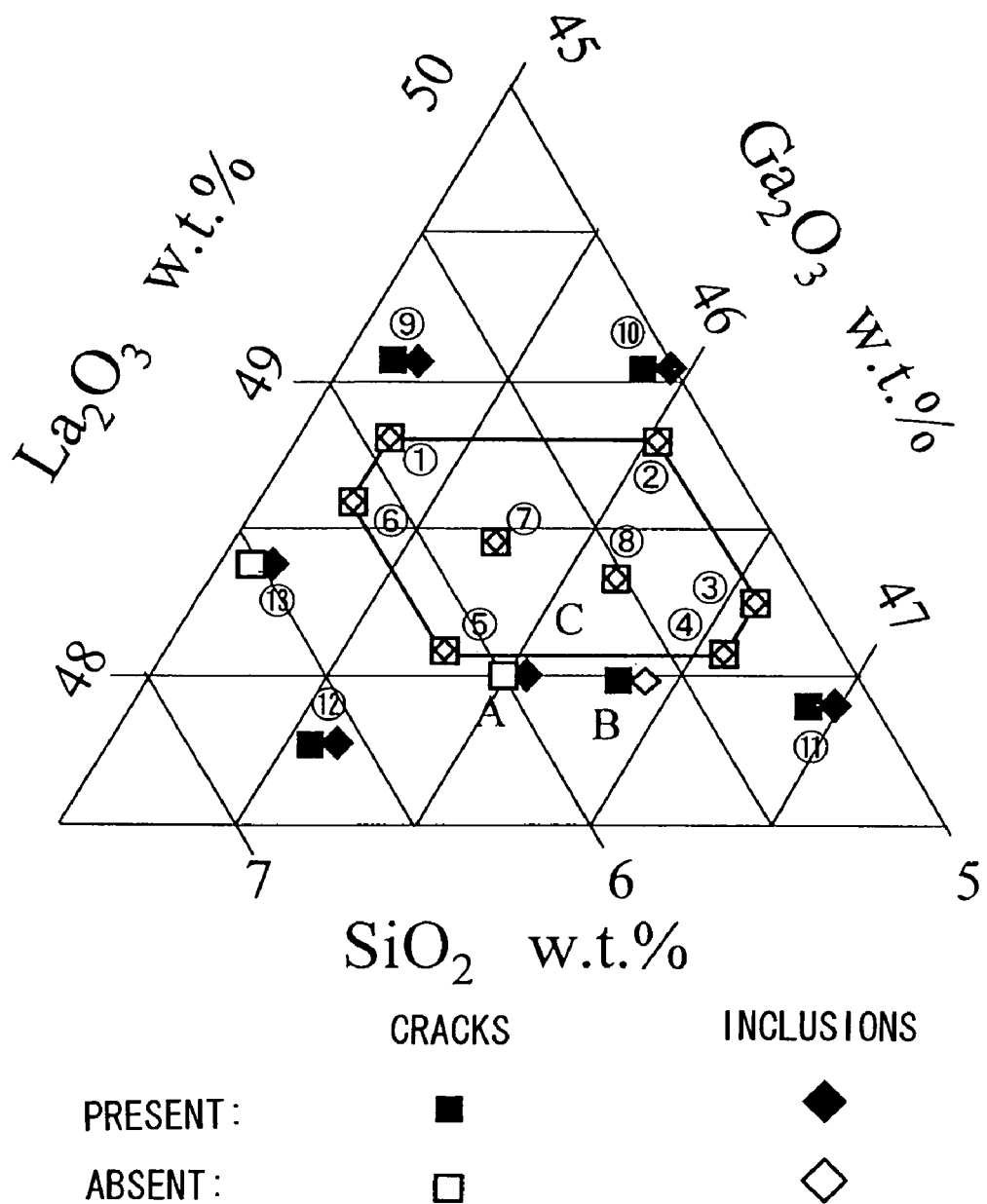
FIG. 21 is a state drawing showing the composition labels of each of the Langasite single crystals grown by varying the compositions and the occurrence of cracks and inclusions in the piezoelectric device substrates in the fourth embodiment and the manufacturing method for the same.
Figure 22:
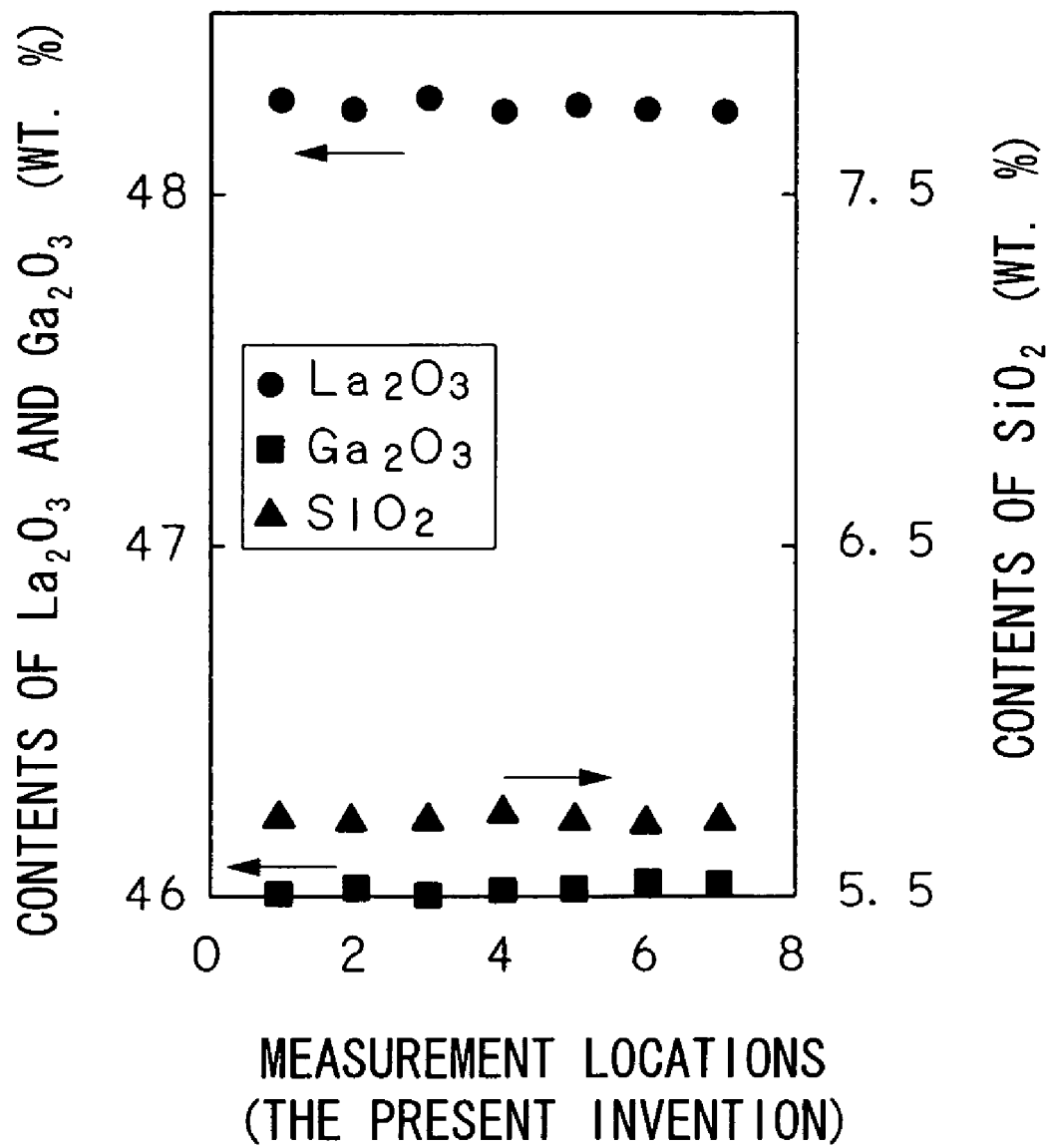
FIG. 22 is a graph showing the contents of each of the raw materials for the measured locations in the longitudinal direction of the crystal in the piezoelectric device substrate in the fourth embodiment and the manufacturing method for the same.

In the manufacturing method described above, the piezoelectric device substrate was manufactured by varying the composition of the $La_2O_3$, $Ga_2O_3$, and $SiO_2$, and the experimental data showing the presence or absence of the occurrence cracks (defects) and inclusions in these substrates is shown in FIG. 21 and FIG. 26. Moreover, the marks in FIG. 21 denote the presence of cracks by ■, and the absence by □, and denotes the presence of inclusions by ♦, and the absence by ◊. In addition the A point in FIG. 21 is the case of a single crystal grown based on the conventional stoichiometric composition, and point B is the case of a single crystal grown based on the composition disclosed in the report that appeared in J. Crystal Growth cited above.

As shown in FIG. 21 and FIG. 26, it can be understood that a high quality crystal was obtained without the occurrence of either cracks or inclusions in the test sample numbers from ① to ⑧, manufactured by the compositions within the composition ranges described above, while in contrast the test samples outside the ranges described above exhibited at least one of either cracks or inclusions.

In addition, among the composition ranges described above, raw materials were weight measured with a composition wherein the $La_2O_3$ was 48.25 wt. %, the $Ga_2O_3$ was 46.02 wt. %, and the $SiO_2$ was 5.73 wt. %, pellets were fabricated and charged in the crucible, and a Langasite single crystal having a diameter of 85 mm and a length of 190 mm in the straight part was grown. Then the composition in the longitudinal direction of the Langasite single crystal was analyzed using wet chemical analysis. As a result, as shown in FIG. 9, FIG. 16, FIG. 22, and FIG. 27, the contents of each of the components was within ±0.05% of the charged composition.

Figure 23A:
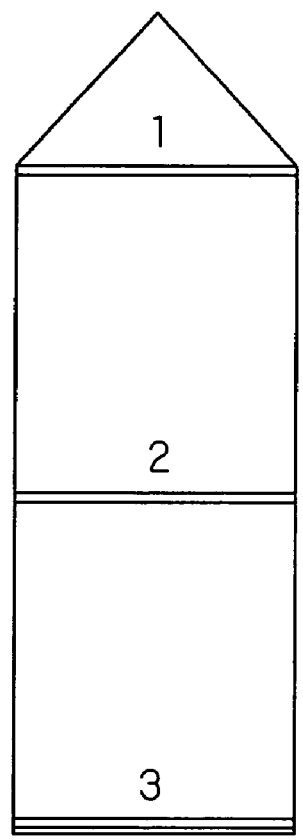
FIG. 23a is a frontal drawing of the single crystal showing the cutout locations of the measurement substrate in the longitudinal direction of the crystal in the piezoelectric device substrate in the fourth embodiment and the manufacturing method for the same.
Figure 23B:
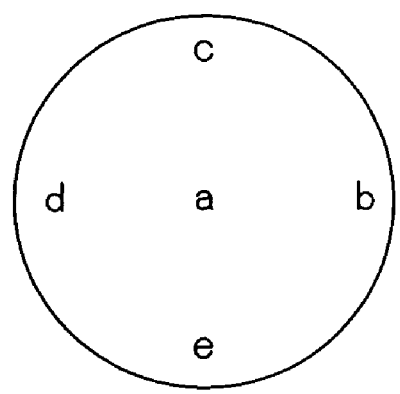
FIG. 23b is a frontal drawing of the substrate showing the measurement locations on the substrate surface in the piezoelectric device substrate in the fourth embodiment and the manufacturing method for the same.

Furthermore, the composition at each point (a, b, c, d) on the substrate surface (in the transverse direction of the crystal) at the top section (wafer 1), the middle section (wafer 2), and the bottom section (wafer 3) of this Langasite single crystal was analyzed using fluorescent X-ray analysis. As a result, as shown in FIG. 23a, FIG. 23b, and FIG. 28, in this case as well, the contents of each of the components was within ±0.05% of the charged composition.

In this manner, in the manufacturing method for the substrate for the piezoelectric device according to the present invention, a Langasite single crystal having good homogeneity from the top section, through the middle section, and to the bottom section was obtained. Furthermore, this Langasite single crystal did not exhibit cracks or inclusions.

Next, this Langasite single crystal was processed by slicing along the Y50 face, processed into a piezoelectric device substrate by lapping and polishing. In order to investigate the variation in the surface acoustic wave velocity (propagation velocity) on the surface of this substrate, like the second embodiment, the SAW filter of the embodiment described above was fabricated, and the center frequency $f_c$ of the SAW filter was measured using a net analyzer.

Figure 24:
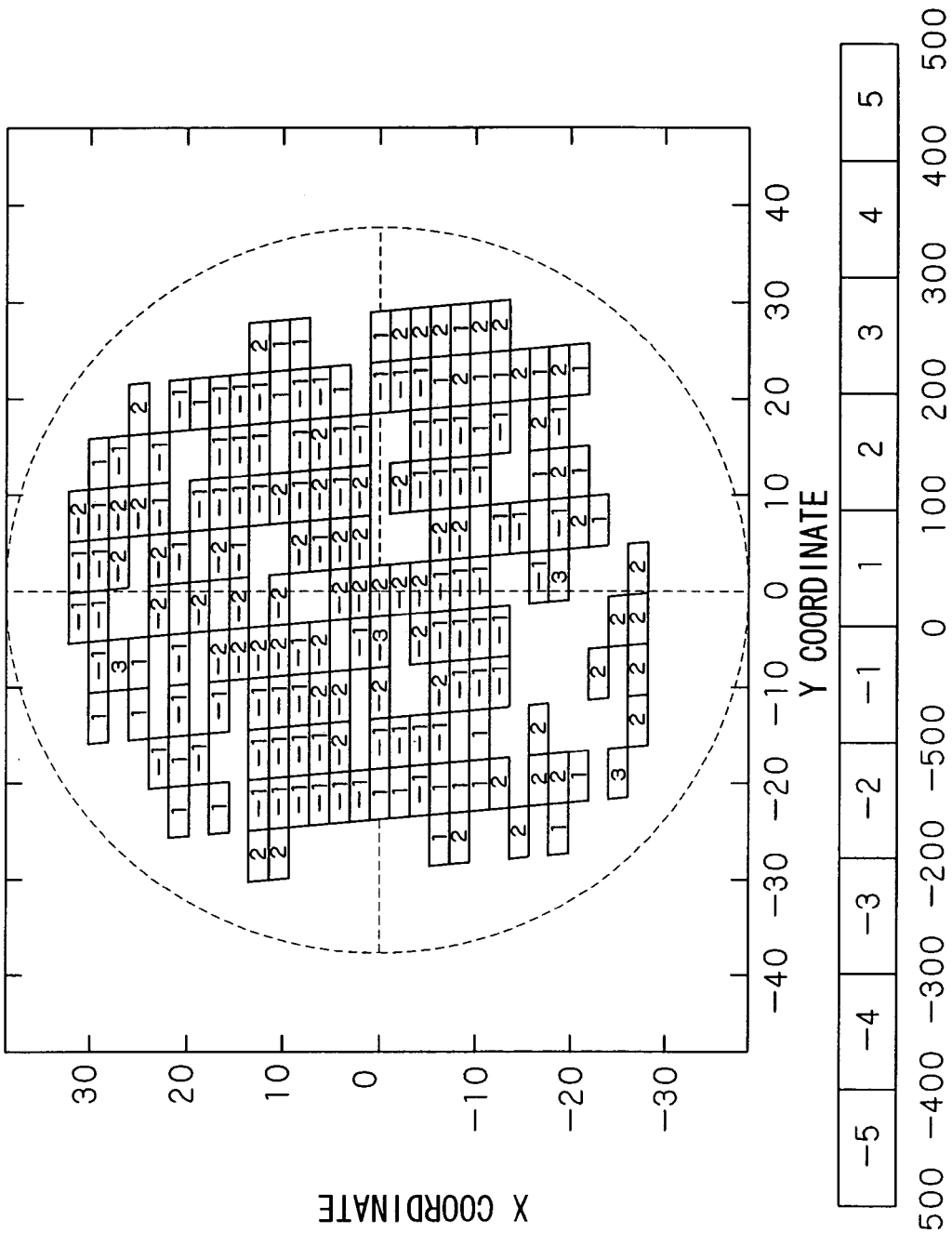
FIG. 24 is a graph showing the variation on the substrate surface of the SAW filter of the SAW acoustic velocity in the surface acoustic wave device in the fourth embodiment.

Furthermore, the overall variation in the substrate from the top, the middle, and the bottom of the crystal was also investigated. As a result, as shown in FIG. 24, the average value of the surface acoustic wave velocity was 2740.36 m/s, the variation was 88.08 ppm, which allowed realizing a variation equal to or less than 100 ppm, and it was possible to improve the homogeneity of the characteristics of the SAW filter due to the homogeneity of the composition of the crystal.

Figure 25:
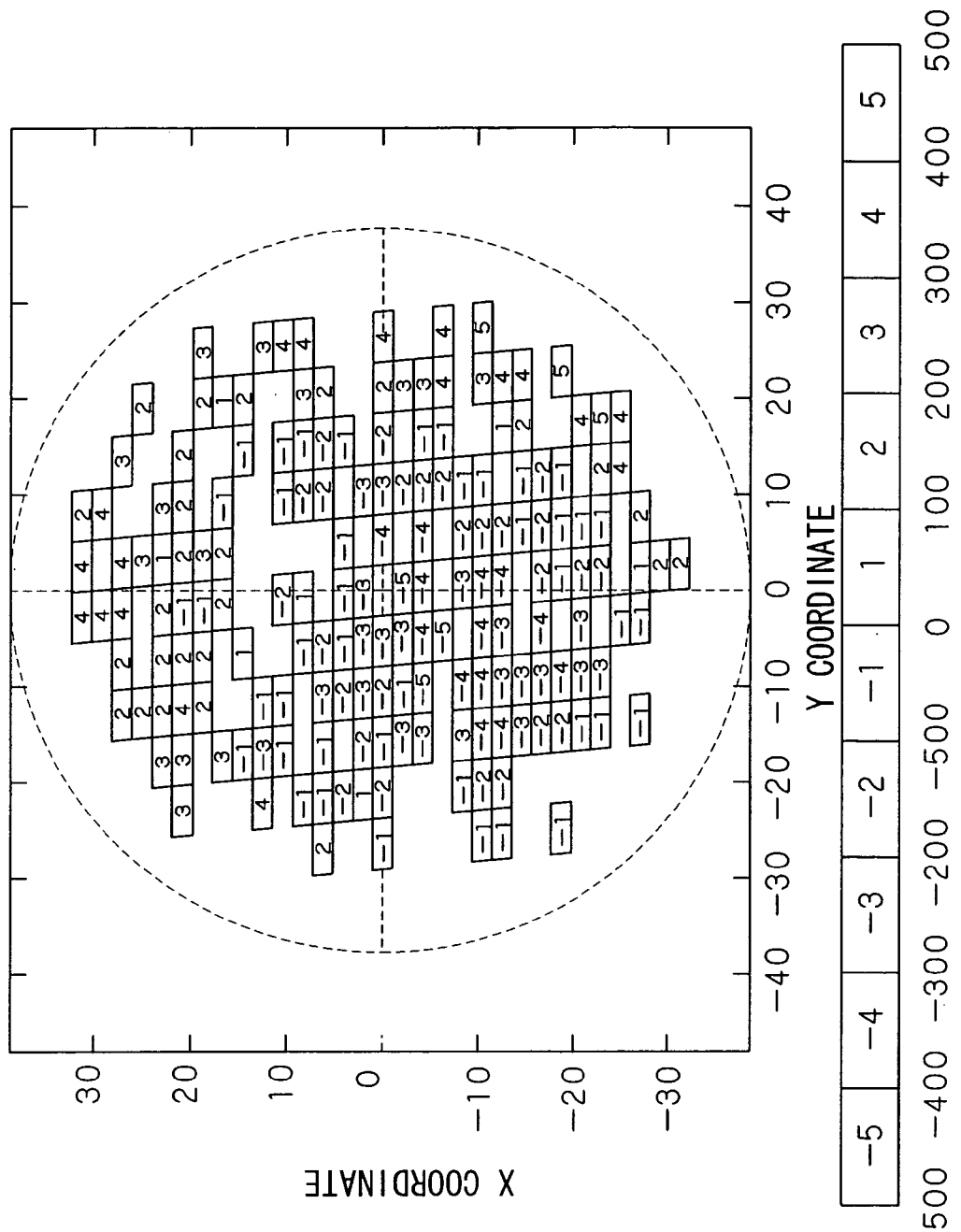
FIG. 25 is a graph showing the variation on the substrate surface of the SAW filter of the SAW acoustic velocity in the surface acoustic wave device in the conventional example.

Moreover, when measuring the center frequency of a SAW filter fabricated from a conventional crystal grown based on the stoichiometric composition ratio as an example, as shown in FIG. 25, the average value of the surface acoustic wave velocity on the substrate surface was 2740.21 m/s, and the variation was 224.9 ppm, and at the same time, the variation in the surface acoustic wave velocity in the direction of the growth of the crystal was 400 ppm, and as a result the variation was too large for it to be used as an elastic wave element.

Specifically, in the present embodiment, the $La_2O_3$, $Ga_2O_3$, and $SiO_2$, which are the raw materials of the Langasite, were each weight measured within the ranges described above, melted in the crucible, and a Langasite single crystal was grown by pulling up from inside the crucible. Thus, a high quality Langasite single crystal having an extremely low occurrence of defects and inclusions was obtained, and at the same time, a substrate having a uniform propagation velocity was obtained. In addition, by obtaining a substrate of a piezoelectric device having a variation in the surface acoustic wave velocity equal to or less than 100 ppm, the homogeneity of the SAW filter was improved by using this substrate, and it was possible to obtain a high quality device at a high yield.

INDUSTRIAL APPLICABILITY

The present invention relates to a Langasite single crystal ingot having a very small variation in the contents of the components lanthanum oxide (hereinbelow, $La_2O_3$), gallium oxide (hereinbelow, $Ga_2O_3$), and silicon oxide (hereinbelow, $SiO_2$) through the entire straight part, excluding the shoulder part that is formed during the early growth by pulling up the seed crystal, and thereby has a superior homogeneity in the contents of the components; in addition, the invention relates to a manufacturing method for a substrate of a piezoelectric device suitable for a SAW filter and a piezoelectric device substrate, and a surface acoustic wave device using the same.

From the results shown in FIG. 4 and FIG. 5, the ingot of the present invention has an extremely low variation in the contents of $La_2O_3$, $Ga_2O_3$, and $SiO_2$, which are components, over the entire ingot. These contents are each within a range of ±0.05% with respect to the target contents at all locations, and has a superior homogeneity. In contrast, in the conventional ingot, the local change in the ingot in the contents of the components described above is extremely large, and clearly the variation range also covers the ±0.05% range.

As described above, the Langasite single crystal ingot of the present invention has a superior homogeneity in the contents of the composition constituent elements over the entire ingot, and thus, for example, when applied to a substrate of a piezoelectric device such as an surface acoustic wave filter or the like, there are industrially applicable properties contributing to expected stable characteristics as well as the lowering of the cost.

In addition, according to the present invention, the respective composition ranges of the $La_2O_3$, $Ga_2O_3$, and $SiO_2$, which are the raw materials for $La_3Ga_5SiO_{14}$, are weight measured within the ranges disclosed in the second embodiment, melted in a crucible, a single crystal of $La_3Ga_5SiO_{14}$ is grown by pulling up from this crucible. In addition, the $La_3Ga_5SiO_{14}$ is a single crystal in which the composition ranges of the $La_2O_3$, $Ga_2O_3$, and $SiO_2$ are set within the ranges disclosed in the second embodiment, and thus a high quality $La_3Ga_5SiO_{14}$ single crystal having extremely few occurrences of growth striation is obtained, and at the same time, a substrate having a uniform center frequency and propagation velocity is obtained. Specifically, the substrate of a piezoelectric device cut out from this crystal has almost no variation in mechanical strength, irregularities due to the grinding process occur with difficulty, and it is possible to obtain uniform and superior SAW filter characteristics. In addition, the variation in the surface acoustic wave propagation velocity is greatly decreased, and the variation in the elastic wave element performance can be made sufficiently small.

In addition, in the manufacturing method for a substrate of a piezoelectric device and the substrate for the piezoelectric device, based on the experimental results described above, the respective composition ranges of the $La_2O_3$, $Ga_2O_3$, and $SiO_2$, which are the raw materials for $La_3Ga_5SiO_{14}$, are weight measured within the ranges of the third embodiment, melted in a crucible, a single crystal of $La_3Ga_5SiO_{14}$ is grown by pulling up from this crucible. In addition, the $La_3Ga_5SiO_{14}$ is a single crystal in which the composition range of the $La_2O_3$, $Ga_2O_3$, and $SiO_2$ are set within the ranges disclosed in the second embodiment, and thus a high quality $La_3Ga_5SiO_{14}$ single crystal having extremely few occurrences of secondary phases is obtained, the crystal cracks with difficulty, and at the same time, there is no need to lower the growth rate and production efficiency can be maintained. In addition, a substrate having a uniform center frequency and propagation velocity can be obtained. Specifically, a Langasite single crystal having a uniform composition in the longitudinal direction and transverse direction can be grown, and a substrate of a piezoelectric device cut out from this crystal a greatly reduced variation in the surface acoustic wave propagation velocity, and the variation in the elastic wave element performance can be made sufficiently small.

In addition, in the manufacturing method for a substrate of a piezoelectric device and the substrate for the piezoelectric device, based on the experimental results described above, the respective composition ranges of the $La_2O_3$, $Ga_2O_3$, and $SiO_2$, which are the raw materials for $La_3Ga_5SiO_{14}$, are weight measured within the ranges of the fourth embodiment, melted in a crucible, a single crystal of $La_3Ga_5SiO_{14}$ is grown by pulling up from this crucible. In addition, the $La_3Ga_5SiO_{14}$ is a single crystal having a composition range wherein $La_2O_3$ is from 48.06 to 48.80 wt. %, $Ga_2O_3$ is from 45.25 to 46.60 wt. %, and $SiO_2$ is from 5.21 to 6.19 wt. %, and thus a high quality $La_3Ga_5SiO_{14}$ single crystal having extremely few cracks and inclusions in the crystal is obtained, and at the same time, a substrate is obtained having a uniform center frequency and propagation velocity. Specifically, a Langasite single crystal having a uniform composition in the longitudinal direction and transverse direction (on substrate surface) can be grown, and a substrate of a piezoelectric device cut out from this crystal has a greatly reduced variation in the surface acoustic wave propagation velocity, and the variation in the elastic wave element performance can be made sufficiently small.

What is claimed is:

1. A Langasite single crystal ingot comprising a single crystal of Langasite having the formula $La_3Ga_5SiO_{14}$ and having a composition within a range in a $La_2O_3/Ga_2O_3/SiO_2$ phase diagram defined by a point at which $La_2O_3$ is 47.82 wt. %, $Ga_2O_3$ is 46.50 wt %, and $SiO_2$ is 5.68 wt. %; a point at which $La_2O_3$ is 47.97 wt. %, $Ga_2O_3$ is 46.27 wt %, and $SiO_2$ is 5.76 wt. %; and a point at which $La_2O_3$ is 48.03 wt. %, $Ga_2O_3$ is 46.49 wt %, and $SiO_2$ is 5.48 wt. %, wherein amounts of lanthanum oxide, gallium oxide, and silicon oxide in a longitudinal cross section and a transverse cross section of a straight part of the Langasite single crystal ingot, excluding the shoulder of the ingot, are ±0.05 wt. % of the composition, a diameter of the Langasite single crystal ingot is 85 mm or more, and the Langasite single crystal ingot is substantially free of growth striations.

2. A substrate of a piezoelectric device which is formed from a Langasite single crystal ingot, wherein the Langasite single crystal ingot is manufactured by melting components having a composition within a range in a $La_2O_3/Ga_2O_3/SiO_2$ phase diagram defined by a point at which $La_2O_3$ is 47.81 wt. %, $Ga_2O_3$ is 46.50 wt %, and $SiO_2$ is 5.69 wt. %; a point at which $La_2O_3$ is 47.97 wt. %, $Ga_2O_3$ is 46.26 wt %, and $SiO_2$ is 5.77 wt. %; and a point at which $La_2O_3$ is 48.04 wt. %, $Ga_2O_3$ is 46.50 wt %, and $SiO_2$ is 5.46 wt. % in a crucible, and growing the Langasite single crystal ingot according to claim 1 by pulling up from the crucible, and variation in propagation velocity of a surface acoustic wave propagating in a direction over the surface to be used for the piezoelectric device is 100 ppm or less.

3. A surface acoustic wave device comprising:

the piezoelectric device substrate according to claim 2; and an electrode formed on a surface of the piezo electric device substrate for transmitting and receiving a surface acoustic wave.

4. A substrate of a piezoelectric device which is formed from the Langasite single crystal ingot according to claim 1, wherein variation in propagation velocity of a surface acoustic wave propagating in a direction over the surface to be used for the piezoelectric device is 100 ppm or less.

5. A surface acoustic wave device comprising:
the piezoelectric device substrate according to claim 4; and
an electrode formed on a surface of the piezoelectric device substrate for transmitting and receiving a surface acoustic wave.

6. A Langasite single crystal ingot comprising a single crystal of Langasite having the formula $La_3Ga_5SiO_{14}$ and having a composition within a range in which $La_2O_3$ is from 48.06 to 48.80 wt. %, $Ga_2O_3$ is from 45.25 to 46.60 wt. %, and $SiO_2$ is from 5.21 to 6.19 wt. %,
wherein amounts of lanthanum oxide, gallium oxide, and silicon oxide in a longitudinal cross section and a transverse cross section of a straight part of the Langasite single crystal ingot, excluding the shoulder of the ingot are ±0 05 wt. % of the composition,
a diameter of the Langasite single crystal ingot is 85 mm or more, and
the Langasite single crystal ingot is substantially free of defects and inclusions.

7. A substrate of a piezoelectric device which is formed from a Langasite single crystal,
wherein the Langasite single crystal ingot is manufactured by melting components having a composition within a range in which $La_2O_3$ is from 48.06 to 48.80 wt. %, $Ga_2O_3$ is from 45.25 to 46.60 wt. %, and $SiO_2$ is from 5.21 to 6.19 wt. % in a crucible, and growing the Langasite single crystal ingot according to claim 6 by pulling up from the crucible, and
variation in propagation velocity of a surface acoustic wave propagating in a direction over the surface to be used for the piezoelectric device is 100 ppm or less.

8. A surface acoustic wave device comprising:
the piezoelectric device substrate according to claim 7; and
an electrode formed on a surface of the piezoelectric device substrate for transmitting and receiving a surface acoustic wave.

9. A substrate of a piezoelectric device which is formed from the Langasite single crystal ingot according to claim 6, wherein variation in propagation velocity of a surface acoustic wave propagating in a direction over the surface to be used for the piezoelectric device is 100 ppm or less.

10. A surface acoustic wave device comprising:
the piezoelectric device substrate according to claim 9; and
an electrode formed on a surface of the piezoelectric device substrate for transmitting and receiving a surface acoustic wave.

11. A method for manufacturing a substrate of a piezoelectric device, comprising:
melting components having a composition within a range in a $La_2O_3/Ga_2O_3/SiO_2$ phase diagram defined by a point at which $La_2O_3$ is 47.81 wt. %, $Ga_2O_3$ is 46.50 wt %, and $SiO_2$ is 5.69 wt. %; a point at which $La_2O_3$ is 47.97 wt. %, $Ga_2O_3$ is 46.26 wt %, and $SiO_2$ is 5.77 wt. %; and a point at which $La_2O_3$ is 48.04 wt. %, $Ga_2O_3$ is 46.50 wt %, and $SiO_2$ is 5.46 wt. % in a crucible;
growing the Langasite single crystal ingot according to claim 1 by pulling up from the crucible, while supplementing the $Ga_2O_3$ such that a total of weights of a melt in the crucible and the grown Langasite single crystal ingot always conform to the weight of the melt in the crucible before the start of the growing; and
processing the Langasite single crystal ingot into a substrate of a piezoelectric device.

12. A method for manufacturing a substrate of a piezoelectric device, comprising:
melting components having a composition within a range in which $La_2O_3$ is from 48.06 to 48.80 wt. %, $Ga_2O_3$ is from 45.25 to 46.60 wt. %, and $SiO_2$ is from 5.21 to 6.19 wt. % in a crucible;
growing the Langasite single crystal ingot according to claim 6 by pulling up from the crucible, while supplementing the $Ga_2O_3$ such that a total of weights of a melt in the crucible and the grown Langasite single crystal ingot always conform to the weight of the melt in the crucible before the start of the growing; and
processing the Langasite single crystal ingot into a substrate of a piezoelectric device.

* * * * *

UNITED STATES PATENT AND TRADEMARK OFFICE
CERTIFICATE OF CORRECTION

PATENT NO. : 7,090,724 B2  
APPLICATION NO. : 10/297491  
DATED : August 15, 2006  
INVENTOR(S) : Wang et al.

Page 1 of 1

It is certified that error appears in the above-identified patent and that said Letters Patent is hereby corrected as shown below:

On the title page, Item (54), and in Column 1 the Title is incorrect. Item (54) and Column 1 should read:

-- LANGASITE SINGLE CRYSTAL INGOT, SUBSTRATE FOR PIEZOELECTRIC DEVICE AND MANUFACTURING METHOD THEREOF, AND SURFACE ACOUSTIC WAVE DEVICE --

On the title page, Item (30), The Foreign Application Priority Data is incorrect. Item (30) should read:

-- (30) Foreign Application Priority Data

| Date | Country | Number |
|---|---|---|
| Dec. 28, 1999 | (JP) | 11-377335 |
| Jan. 7, 2000 | (JP) | 2000-001426 |
| Jun. 1, 2000 | (JP) | 2000-165114 |
| Jun. 1, 2000 | (JP) | 2000-165119 |
| Nov. 10, 2000 | (JP) | 2000-344038 |

--

Signed and Sealed this

First Day of May, 2007

JON W. DUDAS  
*Director of the United States Patent and Trademark Office*